United States Patent
Chang et al.

(10) Patent No.: US 12,538,532 B2
(45) Date of Patent: Jan. 27, 2026

(54) METHOD OF FORMING A GAP UNDER A SOURCE/DRAIN FEATURE OF A MULTI-GATE DEVICE

(71) Applicant: Taiwan Semiconductor Manufacturing Company, Ltd., Hsinchu (TW)

(72) Inventors: Che-Lun Chang, Hsinchu (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 746 days.

(21) Appl. No.: 17/848,701

(22) Filed: Jun. 24, 2022

(65) Prior Publication Data
US 2023/0361176 A1 Nov. 9, 2023

Related U.S. Application Data

(60) Provisional application No. 63/339,688, filed on May 9, 2022.

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01);
(Continued)

(58) Field of Classification Search
CPC .. H10D 30/43; H10D 30/014; H10D 30/6735; H10D 62/121; H10D 64/017;
(Continued)

(56) References Cited

U.S. PATENT DOCUMENTS 9,754,840 B2 9/2017 Lin et al.
9,818,872 B2 11/2017 Ching et al.
(Continued)

FOREIGN PATENT DOCUMENTS

TW 202147456 A 12/2021
TW 202217980 A 5/2022

*Primary Examiner* — Duy T Nguyen
*Assistant Examiner* — Jiyoung Oh
(74) *Attorney, Agent, or Firm* — HAYNES AND BOONE, LLP

(57) ABSTRACT

Multi-gate transistor structures and methods of forming the same are provided. A method according to the present disclosure includes forming a fin-shaped structure over a substrate and including channel layers interleaved by sacrificial layers, recessing the fin-shaped structure to form a source/drain recess, recessing the sidewalls of the sacrificial layers to form inner spacer recesses, depositing a dielectric layer over the substrate and the inner spacer recesses, depositing a polymer layer over the dielectric layer, etching back the polymer layer and the dielectric layer to form inner spacer features in the inner spacer recesses and an inner spacer layer over the portion of the substrate, and epitaxially depositing more than one epitaxial layer from the sidewalls of the plurality of channel layers to form a source/drain feature in the source/drain recess. The source/drain feature and the inner spacer layer define a gap.

20 Claims, 22 Drawing Sheets

(51) Int. Cl.
  *H10D 30/43* (2025.01)
  *H10D 30/62* (2025.01)
  *H10D 30/67* (2025.01)
  *H10D 64/01* (2025.01)
  *H10D 84/01* (2025.01)
  *H10D 84/03* (2025.01)

(52) U.S. Cl.
  CPC ..... *H10D 30/6211* (2025.01); *H10D 30/6713* (2025.01); *H10D 30/6735* (2025.01); *H10D 30/6757* (2025.01); *H10D 64/017* (2025.01); *H10D 64/021* (2025.01); *H10D 84/0128* (2025.01); *H10D 84/013* (2025.01); *H10D 84/0147* (2025.01); *H10D 84/0158* (2025.01); *H10D 84/038* (2025.01)

(58) Field of Classification Search
  CPC ............. H10D 64/252; H10D 84/0188; H10D 84/201; H10H 20/826; A61K 40/4218; H02K 15/027

USPC ........................................................ 257/288
  See application file for complete search history.

(56) References Cited

U.S. PATENT DOCUMENTS

| | | | |
|---|---|---|---|
| 10,032,627 B2 | 7/2018 | Lee et al. | |
| 10,290,546 B2 | 5/2019 | Chiang et al. | |
| 10,475,902 B2 | 11/2019 | Lee et al. | |
| 10,950,731 B1 | 3/2021 | Peng et al. | |
| 11,031,292 B2 | 6/2021 | Ju et al. | |
| 2017/0294343 A1* | 10/2017 | Hu | H10D 64/021 |
| 2018/0174919 A1* | 6/2018 | Su | H01L 21/0337 |
| 2018/0301564 A1* | 10/2018 | Kwon | H10D 64/017 |
| 2019/0165174 A1* | 5/2019 | Peng | H10D 30/797 |
| 2020/0052086 A1* | 2/2020 | Yang | H10D 30/43 |
| 2020/0168463 A1* | 5/2020 | Ko | H01L 21/3081 |
| 2020/0227534 A1* | 7/2020 | Chiang | H10D 30/6735 |
| 2021/0193829 A1 | 6/2021 | Reznicek | |

* cited by examiner

METHOD OF FORMING A GAP UNDER A SOURCE/DRAIN FEATURE OF A MULTI-GATE DEVICE

PRIORITY DATA

This application claims priority to U.S. Provisional Patent Application No. 63/339,688, filed May 9, 2022, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

A channel region of an MBC transistor includes vertically stacked nanostructures disposed over a mesa that extends from a substrate. Source/drain features of the MBC transistor are formed in source/drain recesses adjacent the mesa. While the gate structure of the MBC transistor wraps around each of the nanostructures, it may only engage a top surface of the mesa. This limited engagement provides little or no gate control of the mesa. When source/drain features are allowed to contact the mesa, a leakage path may be created. While existing transistor structures are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
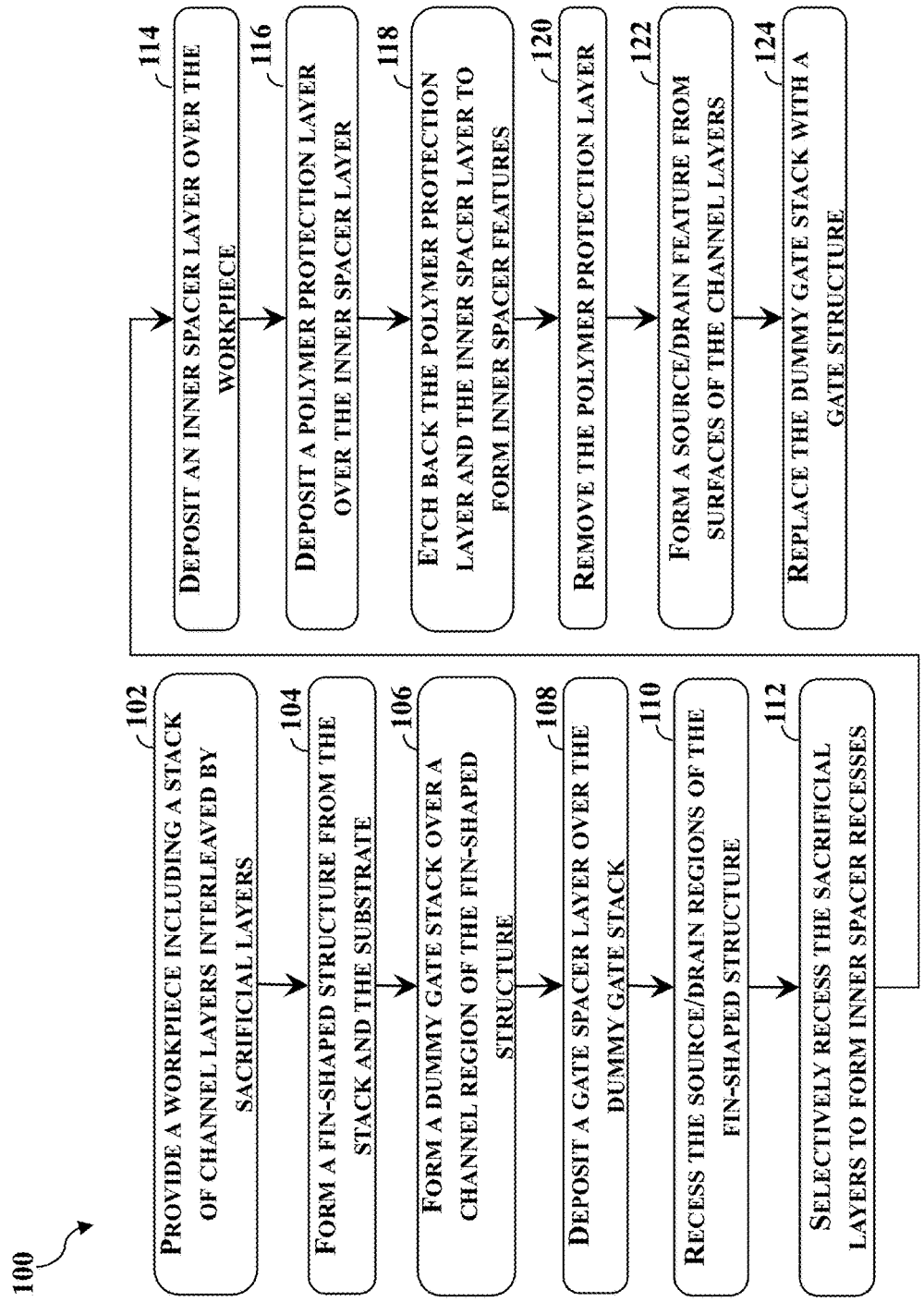
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to leakage prevention of multi-gate transistors. As described above, an MBC transistor is a type of multi-gate transistor where a vertical stack of nanostructures are suspended between two source/drain features and a gate structure wraps around each of the vertical stack of the nanostructures. The nanostructures may come in different shapes and may include nanowires, nanobars, nanosheets, or other types of nanostructures. The vertical stack of nanostructures is disposed over a mesa or a base fin that is patterned from a semiconductor substrate. To form source/drain features to couple to the nanostructures, source/drain trenches adjacent the mesa. While the gate structure wraps around each of the nanostructures, the gate structure only engages a top surface of the mesa. The gate structure therefore exerts limited control over the mesa. When the source/drain features are in contact with the mesa, a leakage path can be created between the source/drain features and the bulk substrate. Additionally, configuration of the source/drain features may affect performance of the MBC transistor. For example, when a volume of the source/drain feature is large, the source/drain resistance may be reduced. When a volume of the second source/drain feature is small, a source-gate capacitance may be reduced. There is a need for a method and structure to prevent through-mesa leakage while keeping resistive-capacitive (RC) delay in check.

The present disclosure provides a method and a structure to reduce leakage current of an MBC transistor by minimizing contact between source/drain features and the underlying substrate and a mesa connected thereto. A method according to the present disclosure includes forming a fin-shaped structure over a substrate. The fin-shaped structure includes channel layers interleaved by sacrificial layers. The method further includes recessing the fin-shaped structure to form a source/drain recess, recessing the sidewalls of the sacrificial layers to form inner spacer recesses, depositing a dielectric layer over the substrate and the inner spacer recesses, depositing a polymer layer over the dielectric layer, etching back the polymer layer and the dielectric layer to form inner spacer features in the inner spacer recesses and an inner spacer layer over the portion of the substrate, and epitaxially depositing more than one epitaxial layer from the sidewalls of the plurality of channel layers to form a source/drain feature in the source/drain recess. Because the polymer layer protects a lower portion of the dielectric layer, the etching back forms an inner spacer layer that covers the substrate. As epitaxial growth is selective to semiconductor surfaces, the source/drain feature is vertically spaced apart from the inner spacer layer. The source/drain feature can be formed larger to reduce contact resistance or formed smaller to reduce parasitic capacitance. A larger source/drain feature may be accompanied by a smaller gap and a smaller source/drain feature may be accompanied by a larger gap.

The various aspects of the present disclosure will now be described in more detail with reference to the figures. In that regard, FIG. 1 is a flowchart illustrating a method 100 of forming a semiconductor structure from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-22, which are fragmentary cross-sectional views or top views of workpiece 200 at different stages of fabrication according to embodiments of the method 100 in FIG. 1. Because the workpiece 200 will be fabricated into a semiconductor structure or a semiconductor device, the workpiece 200 may be referred to herein as a semiconductor structure 200 or a semiconductor device 200 as the context requires. For avoidance of doubts, the X, Y and Z directions in FIGS. 2-22 are perpendicular to one another and used consistently. Throughout the present disclosure, unless expressly otherwise described, like reference numerals denote like features.

Figure 2:
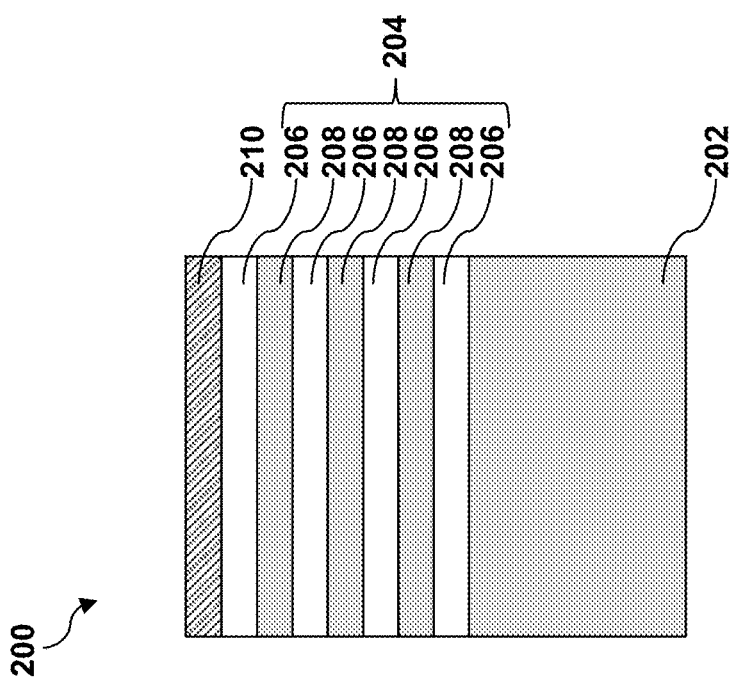
FIGS. 2-21 illustrate fragmentary cross-sectional views or top views of a workpiece during a fabrication process according to the method of FIG. 1, according to one or more aspects of the present disclosure.

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the p-type dopant for forming the p-type well may include boron (B) or gallium (Ga). The suitable doping may include ion implantation of dopants and/or diffusion processes. The substrate 202 may also include other semiconductors such as germanium (Ge), silicon carbide (SiC), silicon germanium (SiGe), germanium tin (GeSn), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. It can also be said that the channel layers 208 are interleaved by the sacrificial layers 206. The first and second semiconductor composition may be different. In some embodiments, the sacrificial layers 206 include silicon germanium (SiGe) or germanium tin (GeSn) and the channel layers 208 include silicon (Si). It is noted that four (4) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10. In the embodiments represented in FIG. 2, the stack 204 includes a bottommost sacrificial layer 206 and a topmost sacrificial layer 206. In the embodiments, the topmost sacrificial layer 206 functions to protect the topmost channel layer and may be completely consumed in subsequent processes.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may become channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel members, which are formed from the channel layers 208, for a subsequently-formed multi-gate device and the thickness of each of the sacrificial layers 206 is chosen based on device performance considerations. In some alternative embodiments, the topmost sacrificial layer 206 may have a thickness greater than the other sacrificial layers 206 to better serve its function to protect the underlying channel layers 208.

The sacrificial layers 206 and channel layers 208 in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 atoms/cm$^3$ to about $1 \times 10^{17}$ atoms/cm$^3$), where for example, no intentional doping is performed during the epitaxial growth processes for the stack 204. In some alternative embodiments, the sacrificial layers 206 may include silicon germanium (SiGe) and the channel layers 208 include silicon (Si).

Figure 3:
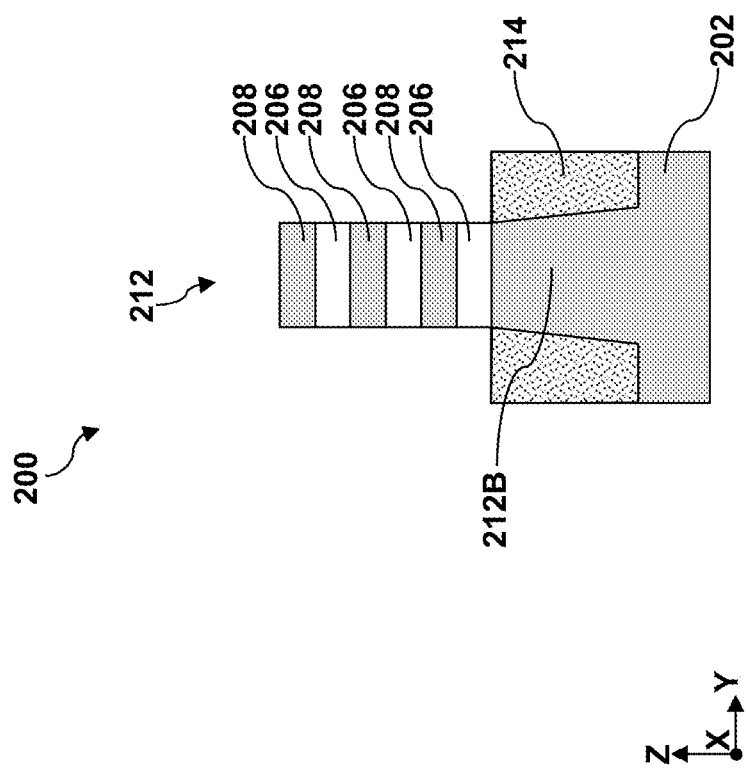

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer disposed over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending vertically through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212 that includes the sacrificial layers 206 and the channel layers 208 extends vertically along the Z direction from the substrate 202 and lengthwise along the X direction. As shown in FIG. 3, the fin-shaped structure 212 includes a base fin structure 212B patterned from the substrate 202. The patterned stack 204, including the sacrificial layers 206 and the channel layers 208, is disposed directly over the base fin structure 212B. The base fin structure 212B may also be referred to as a mesa 212B or a mesa structure 212B.

An isolation feature 214 is formed adjacent the fin-shaped structure 212. In some embodiments represented in FIG. 3, the isolation feature 214 is disposed on sidewalls of the base fin structure 212B. In some embodiments, the isolation feature 214 may be formed in the trenches to isolate the fin-shaped structures 212 from a neighboring fin-shaped structure. The isolation feature 214 may also be referred to as a shallow trench isolation (STI) feature 214. In an example process to form the isolation feature 214, a dielectric layer is first deposited over the substrate 202, filling the trenches with the dielectric layer. The dielectric layer may include silicon oxide, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the isolation feature 214 shown in FIG. 3. The fin-shaped structure 212 rises above the isolation feature 214 after the recessing, while the base fin structure 212B is substantially embedded or buried in the isolation feature 214.

Figure 4:
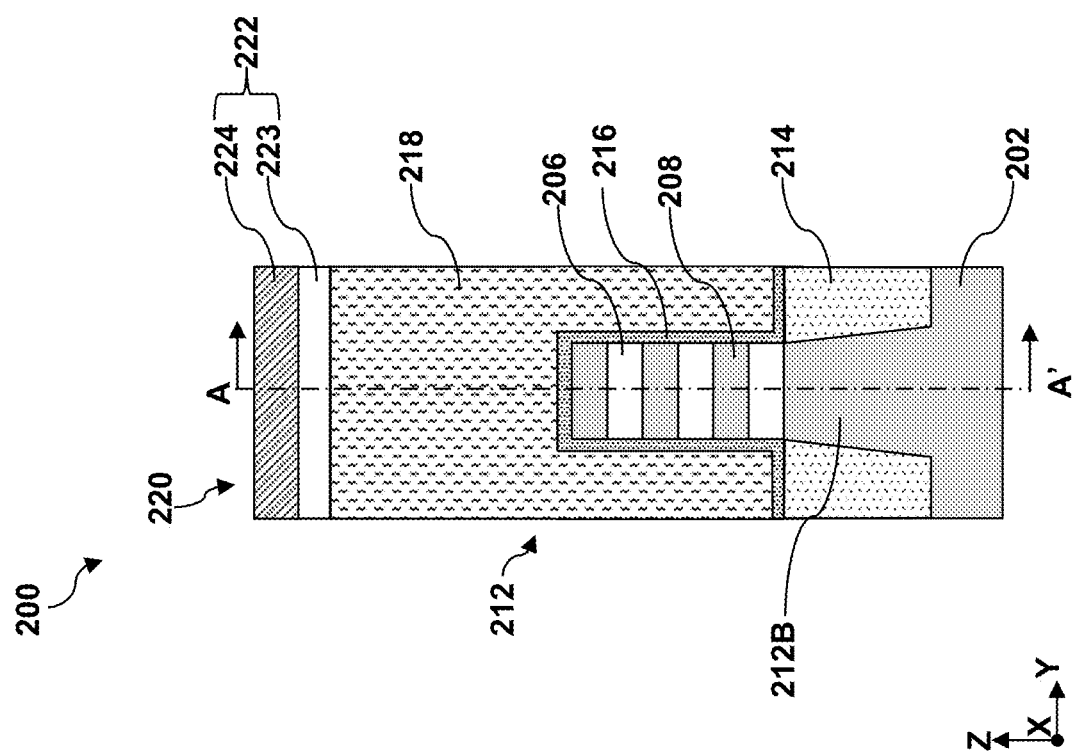
Figure 5:
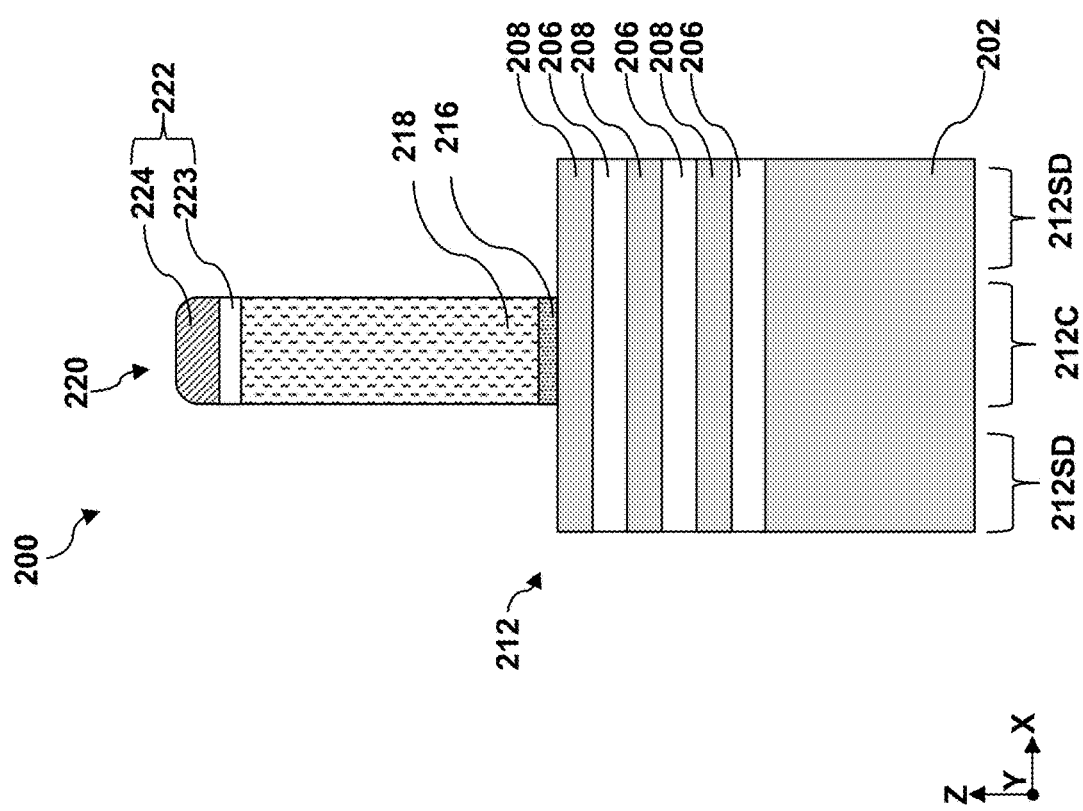

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by a functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, the dummy gate stack 220 is patterned such that it is only disposed over the channel region 212C, not disposed over the source/drain region 212SD. Like the fin-shaped structure 212, the dummy gate stack may be patterned using double-patterning or multi-patterning processes.

Figure 6:
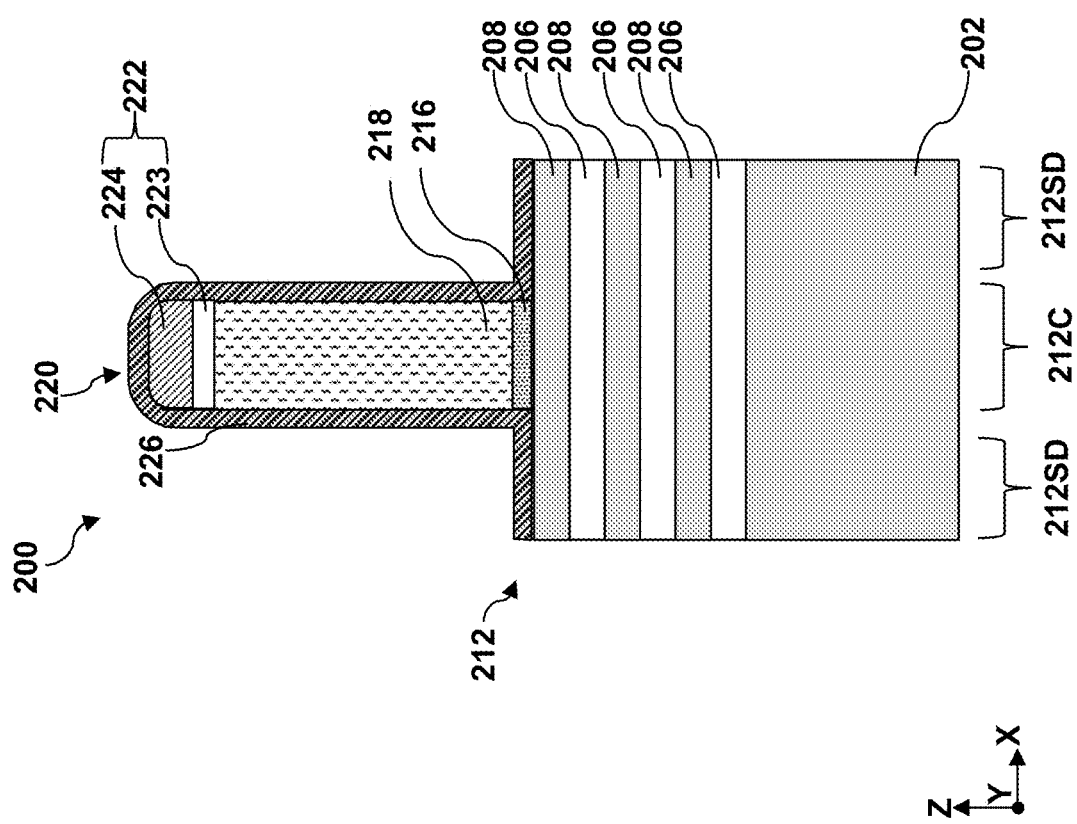

Referring to FIGS. 1 and 6, method 100 includes a block 108 where a gate spacer layer 226 is deposited over the workpiece 200, including over the dummy gate stack 220. In some embodiments, the gate spacer layer 226 is deposited conformally over the workpiece 200, including over top surfaces and sidewalls of the dummy gate stack 220. The term "conformally" may be used herein for ease of description of a layer having substantially uniform thickness over various regions. The gate spacer layer 226 may be a single layer or a multi-layer. The at least one layer in the gate spacer layer 226 may include silicon carbonitride, silicon oxycarbide, silicon oxycarbonitride, or silicon nitride. The gate spacer layer 226 may be deposited over the dummy gate stack 220 using processes such as, a CVD process, a subatmospheric CVD (SACVD) process, an ALD process, or other suitable process.

Figure 7:
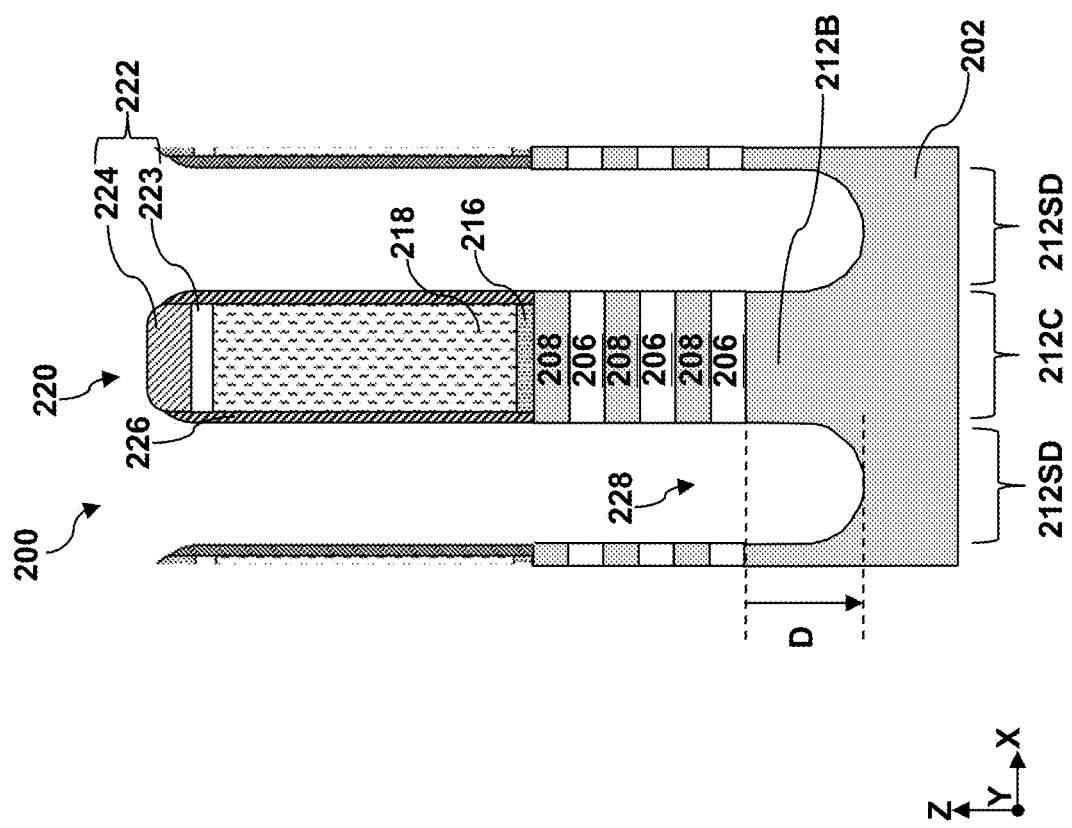

Referring to FIGS. 1 and 7, method 100 includes a block 110 where a source/drain region 212SD of the fin-shaped structure 212 is anisotropically recessed to form a source/drain trench 228. The anisotropic etch may include a dry etch or a suitable etch process that etches the source/drain regions 212SD and a portion of the substrate 202 below the source/drain regions 212SD. The resulting source/drain trench 228 extends vertically through the depth of the stack 204 and partially into the substrate 202. An example dry etch process for block 110 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 7, the source/drain regions 212SD of the fin-shaped structure 212 are recessed to expose sidewalls of the sacrificial layers 206, sidewalls of the channel layers 208, and sidewalls of the base fin structure 212B. Because the source/drain trenches 228 extend below the stack 204 into the substrate 202, the source/drain trenches 228 include bottom surfaces and lower sidewalls defined in the base fin structure 212B. The source/drain trench 228 may have depth D between about 10 nm and about 30 nm.

Figure 8:
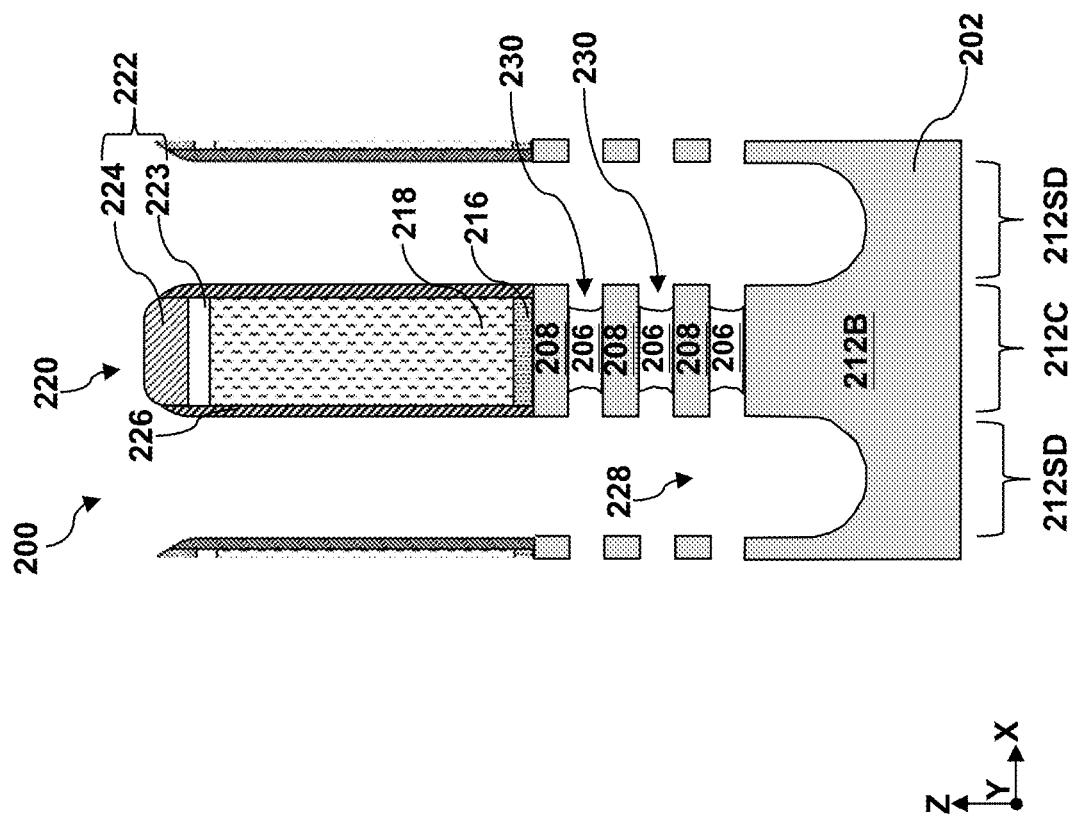

Referring to FIGS. 1 and 8, method 100 includes a block 112 where sacrificial layers 206 are selectively and partially recessed to form inner spacer recesses 230. As illustrated in FIG. 8, the sacrificial layers 206 (shown in FIG. 7 but is removed in FIG. 8) exposed in the source/drain trenches 228 are selectively and partially recessed to form inner spacer recesses 230 while the gate spacer layer 226, the exposed portion of the base fin structure 212B, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 9:
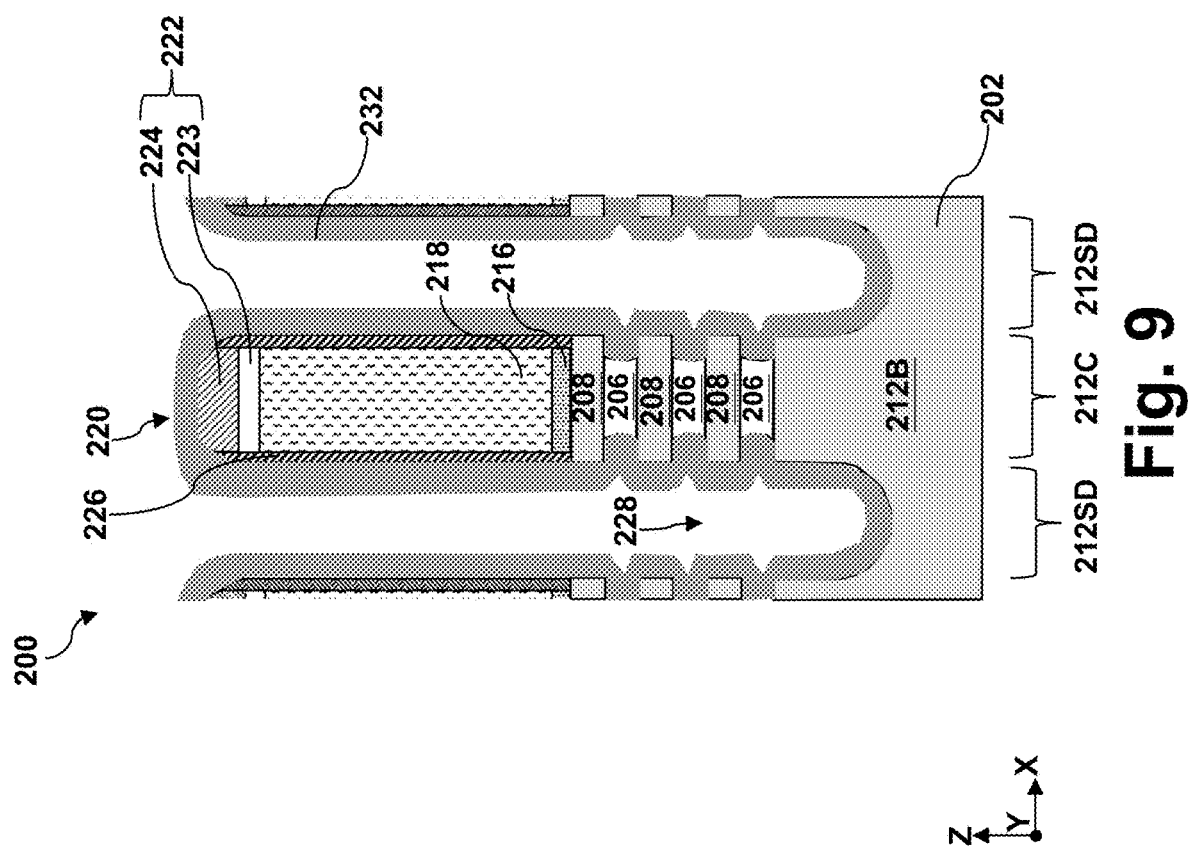

Referring to FIGS. 1 and 9, method 100 includes a block 114 where an inner spacer material layer 232 is conformally deposited over the workpiece 200. After the inner spacer recesses 230 are formed, the inner spacer material layer 232 is deposited over the workpiece 200, including over the gate spacer layer 226, the inner spacer recesses 230, sidewalls and a top-facing surface of the base fin structure 212B. The inner spacer material layer 232 may be formed of a dielectric material that includes silicon, oxygen, carbon, and/or nitrogen. In some embodiments, the inner spacer material layer 232 may include silicon oxide, silicon oxycarbonitride, silicon nitride, silicon oxynitride, carbon-rich silicon carbonitride, or a suitable low k dielectric material. In one example, the inner spacer material layer 232 includes silicon oxycarbonitride. While the inner spacer material layer 232 depicted in FIG. 9 is a single layer, the inner spacer material layer 232 may be a multilayer. In some implementations, the inner spacer material layer 232 may be deposited using CVD, PECVD, SACVD, ALD or other suitable methods. As shown in FIG. 9, the inner spacer material layer 232 may be deposited into the inner spacer recesses 230 as well as over the sidewalls of the channel layers 208, sidewalls of the base fin structure 212B, and surfaces of the base fin structure 212B exposed in the source/drain trenches 228.

Figure 10:
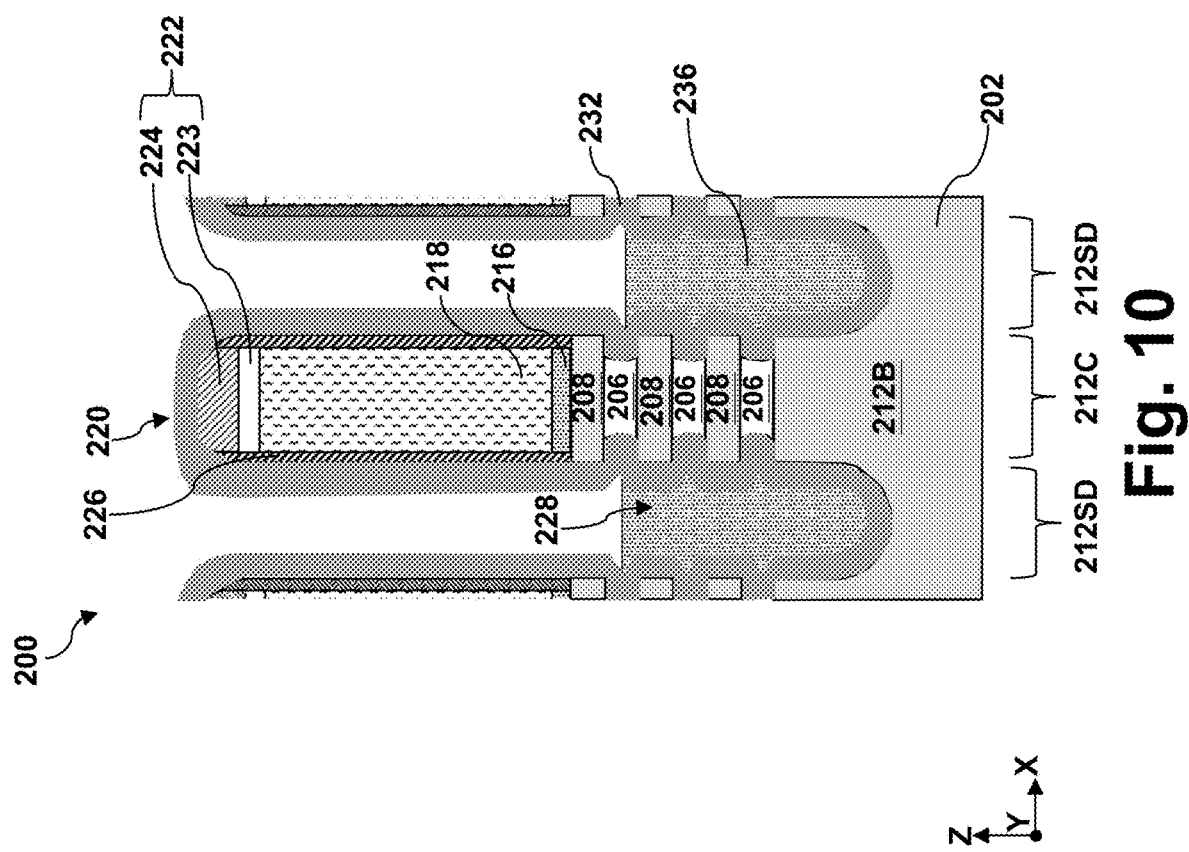

Referring to FIGS. 1 and 10, method 100 includes a block 116 where a polymer protection layer 236 is deposited over the inner spacer material layer 232. The polymer protection layer 236 is formed of fluorine-containing polymer and its molecular structure includes silicon (Si), carbon (C), nitrogen (N), or fluorine (F). In one example, the polymer protection layer 236 includes fluorinated silicone or fluorinated polysilane. The polymer protection layer 236 may be deposited using CVD, flowable CVD (FCVD), or spin-on coating. In some embodiments, the deposited polymer protection layer 236 may then be cured by annealing or ultraviolet (UV) light. After the polymer protection layer 236 is deposited and/or cured, the polymer protection layer 236 has a top surface lower than a top surface of the fin-shaped structure 212. In other words, the top surface of the polymer protection layer 236 is lower than a top surface of the topmost channel layer 208. The polymer protection layer 236 functions to protect the inner spacer material layer 232 on the base fin structure 212B, which is an extension of the substrate 202, so as to keep the base fin structure 212B covered by the inner spacer material layer 232 after a subsequent etch back operation. In this regard, the polymer protection layer 236 should have sufficient thickness along the Z direction to protect the underlying inner spacer material layer 232. In some embodiments, while the top surface of the polymer protection layer 236 is lower than the top surface of the topmost channel layer 208, the top surface of the polymer protection layer 236 is higher than the second topmost channel layer 208. In some alternative embodiments, the top surface of the polymer protection layer 236 may still be higher than the topmost channel layer 208 after deposition/curing of the polymer protection layer 236. In these alternative embodiments, the deposited polymer protection layer 236 is selectively etched back until its top surface is lower than the topmost channel layer 208 and higher than the second topmost channel layer 208.

Figure 11:
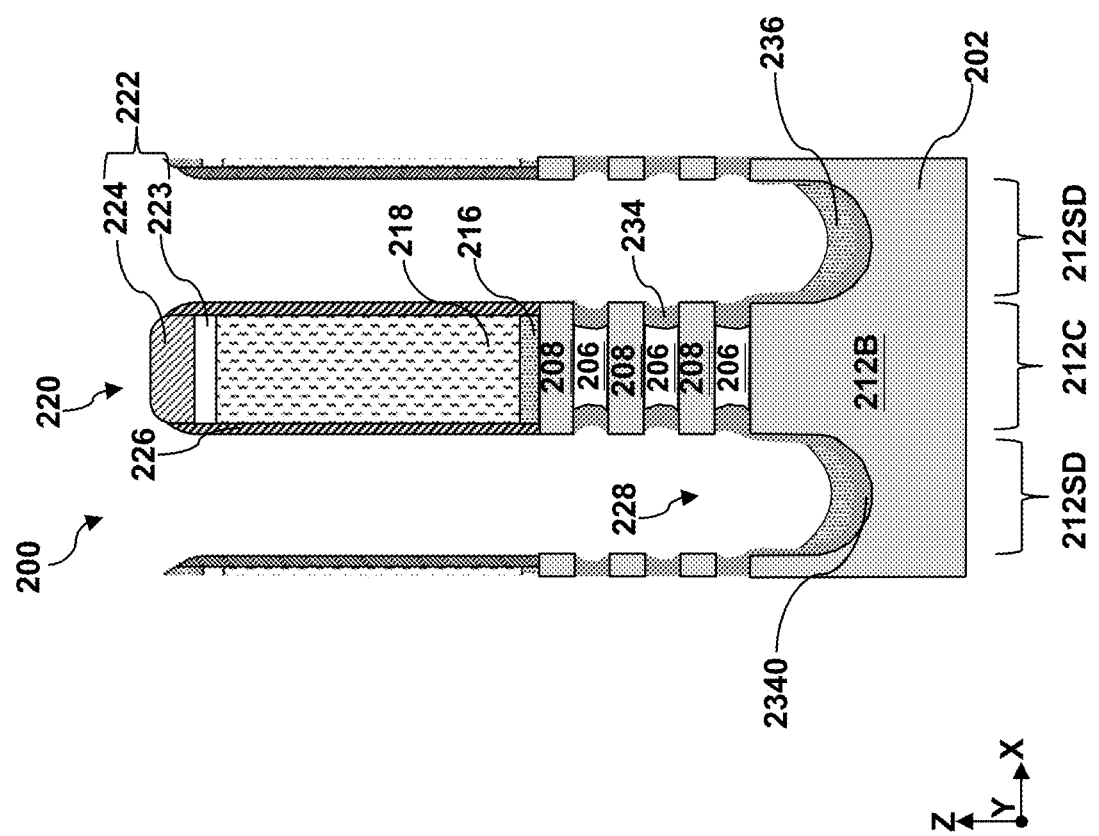

Referring to FIGS. 1 and 11, method 100 includes a block 118 where the polymer protection layer 236 and the inner spacer material layer 232 are etched back to form inner spacer features 234. Referring to FIG. 11, the inner spacer material layer 232 and the polymer protection layer 236 deposited thereon are then anisotropically etched back to remove the inner spacer material layer 232 from the sidewalls of the channel layers 208 to form the inner spacer features 234 in the inner spacer recesses 230. At block 118, the inner spacer material layer 232 may also be removed from the top surfaces and/or sidewalls of the gate-top hard mask layer 222 and the gate spacer layer 226. In some implementations, the etch back operations performed at block 118 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 11, each of the inner spacer features 234 is in direct contact with the recessed sacrificial layers 206 and is disposed vertically (along the Z direction) between two neighboring channel layers 208. According to the present disclosure, the polymer protection layer 236 is etched slower than the inner spacer material layer 232 such that the polymer protection layer 236 can protect bottom portions 2340 of the inner spacer material layer 232 directly over the base fin structure 212B. As a result, as representatively shown in FIG. 11, not all polymer protection layer 236 is etched away from the source/drain regions 212SD. In this regard, operations at block 118 also form a bottom inner spacer layer 2340 over the top-facing surface and sidewalls of the base fin structure 212B.

Figure 12:
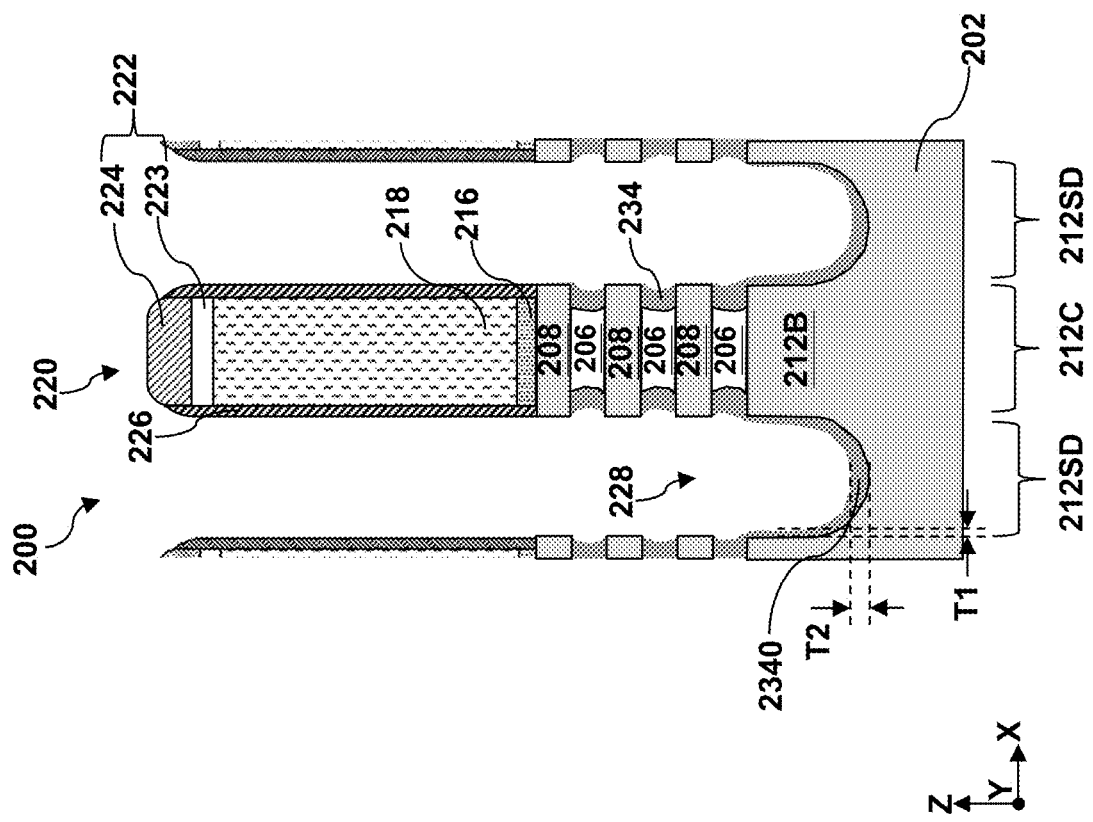

Referring to FIGS. 1 and 12, method 100 includes a block 120 where the polymer protection layer 236 is removed. Before any of the epitaxial layers are formed, method 100 may include a cleaning process to clean surfaces of the workpiece 200. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and/or hydrofluoric acid for oxide removal. The dry clean process may include use of plasma of nitrogen ($N_2$) and hydrogen ($H_2$) treatment. The hydrogen treatment may convert silicon on the surface to silane ($SiH_4$), which may be pumped out for removal. In some embodiments, the cleaning process may remove the residual polymer protection layer 236. Referring to FIG. 12, the bottom inner spacer layer 2340 disposed directly on the top-facing surface and sidewalls of the base fin structure 212B does not have uniform thickness. As described above, the etching back at block 118 etches the inner spacer material layer 232 faster than it does the polymer protection layer 236. The bottom inner spacer layer 2340 includes a lower portion on a top-facing surface of the base fin portion 212B and a sidewall portion on sidewalls of the base fin portion 212B. Because the polymer protection layer 236 slows down the etching back, the lower portion is thicker than the sidewall portion. As shown in FIG. 12, the sidewall portion has a first thickness T1 and the lower portion has a second thickness T2. In some instances, the first thickness T1 is between about 1 nm and about 4 nm and the second thickness T2 is between about 2 nm and about 5 nm. It is observed that, due to the use of the polymer protection layer 236, a ratio of the second thickness T2 to the first thickness T1 may be between 1.2 and 2.

Figure 13:
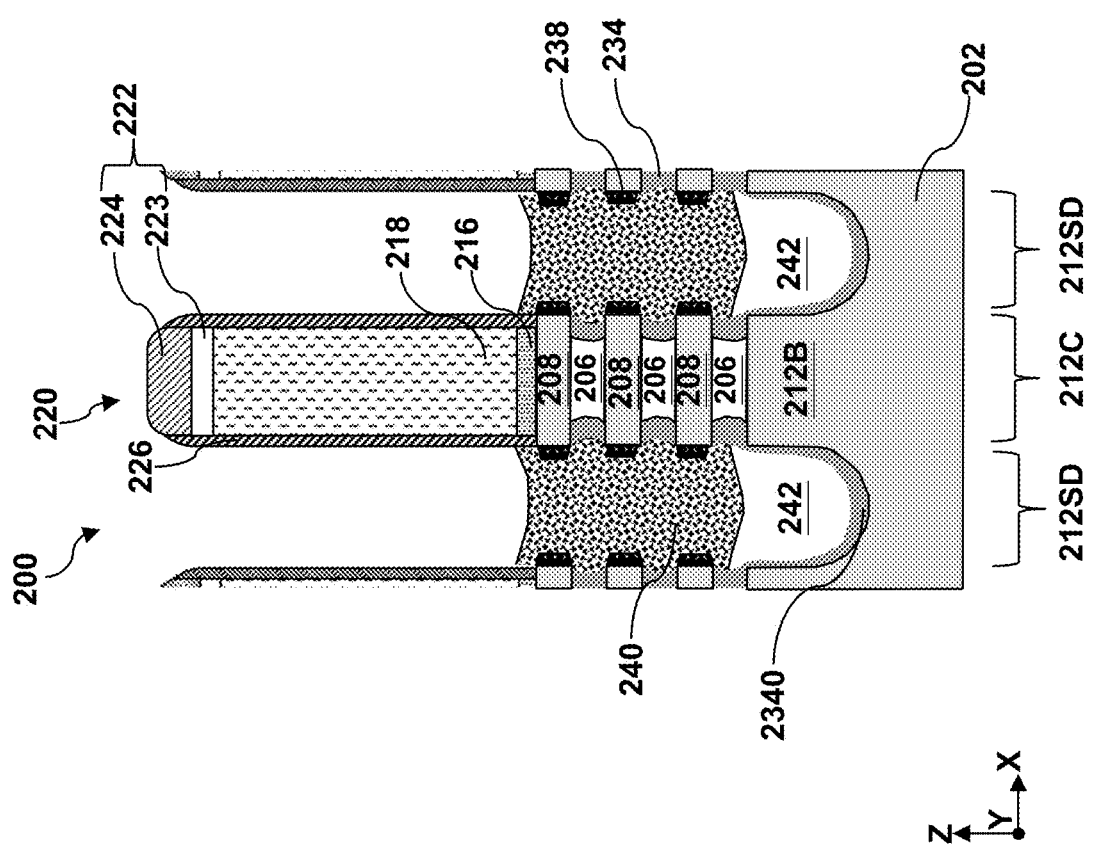
Figure 14:
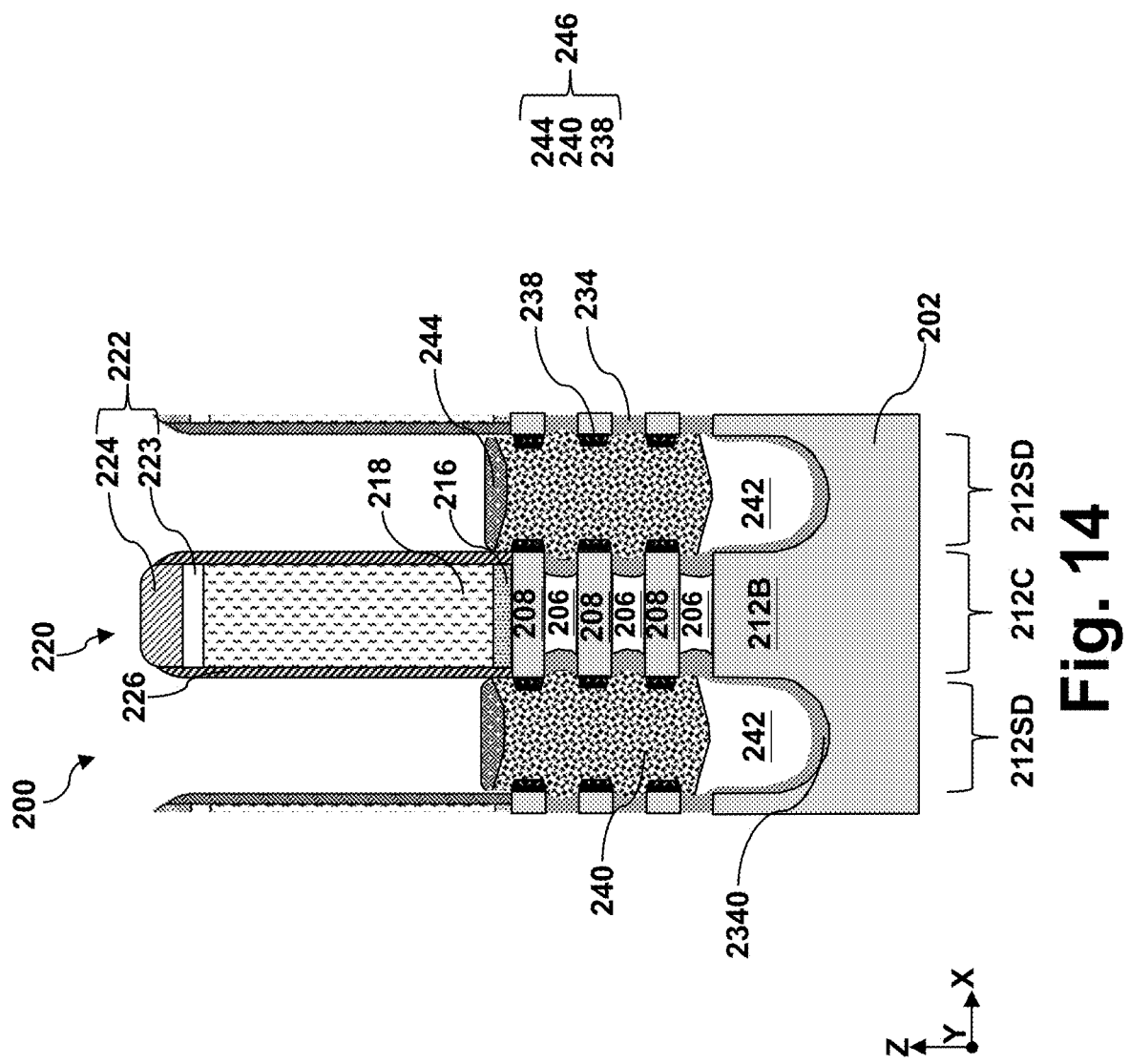

Referring to FIGS. 1, 13 and 14, method 100 includes a block 122 where source/drain features 246 are formed from surfaces of the channel layers 208. In the depicted embodiments, the source/drain feature 246 includes a first epitaxial layer 238, a second epitaxial layer 240, and a third epitaxial layer 244. Operations at block 122 includes epitaxial deposition of the first epitaxial layer 238 from sidewalls of the channel layers 208 (shown in FIG. 13), epitaxial deposition of the second epitaxial layer 240 (shown in FIG. 13), and epitaxial deposition of the third epitaxial layer 244 (shown in FIG. 14). According to the present disclosure, the first epitaxial layer 238 is selectively deposited on sidewalls of the channel layers 208. To ensure selective deposition of the first epitaxial layer 238, the first epitaxial layer 238 may be deposited using a growth-etch deposition process or a cyclic deposition process. As its name suggests, the growth-etch deposition process includes a growth component (or growth cycles) and an etch component (or etch cycles). The growth component (or growth cycles) selectively deposits the first epitaxial layer 238 primarily on semiconductor surfaces (i.e., surfaces of the channel layers 208) and the etch component (or etch cycles) removes the first epitaxial layer 238 deposited on non-semiconductor surfaces (e.g., inner spacer features 234, gate spacer layer 226, and bottom inner spacer layer 2340).

The first epitaxial layer 238 may be n-type or p-type. When the first epitaxial layer 238 is n-type, it may include phosphorus-doped silicon (Si:P) or arsenic-doped silicon (Si:As). When the first epitaxial layer 238 is p-type, it may include boron-doped silicon germanium (SiGe:B). In some embodiments, the first epitaxial layer 238 may be in-situ doped. When the dopant in the first epitaxial layer 238 is phosphorus (P), the growth-etch deposition process includes growth cycles that include use of phosphine ($PH_3$). When the dopant in the first epitaxial layer 238 is arsenic (As), the growth-etch deposition process includes growth cycles that include use of arsine ($AsH_3$). When the dopant in the first epitaxial layer 238 is boron (B), the growth-etch deposition process includes growth cycles that include use of boron trifluoride ($BF_3$). The first epitaxial layer 238 functions as a shielding epitaxial layer that reduces dopant diffusion from a second epitaxial layer to the channel layers 208. To properly function as a shielding epitaxial layer, the first epitaxial layer 238 is formed such that it completely covers all exposed surfaces of the channel layers 208. In some instances, the growth-etch deposition process may include between about 2 and about 5 growth cycles and between about 2 and about 5 etch cycles. In one embodiment, the growth-etch deposition process may include between about 2 and about 3 growth cycles and between about 2 and about 3 etch cycles to achieve satisfactory coverage of the first epitaxial layer 238 over the channel layers 208.

The second epitaxial layer 240 may be deposited using vapor-phase epitaxy (VPE), ultra-high vacuum CVD (UHV-CVD), molecular beam epitaxy (MBE), and/or other suitable processes. The second epitaxial layer 240 is a heavily doped semiconductor layer to reduce parasitic resistance. For that reason, resistance reduces when the volume of the second epitaxial layer 240 increases. Like the first epitaxial layer, the second epitaxial layer 240 may be n-type or p-type and may be in-situ doped. When the second epitaxial layer 240 is n-type, it may include phosphorus-doped silicon (Si:P) or arsenic-doped silicon (Si:As). When the second epitaxial layer 240 is p-type, it may include boron-doped silicon germanium (SiGe:B). It is noted that the dopant concentration in the second epitaxial layer 240 is greater than the dopant concentration in the first epitaxial layer 238, whether the dopant in the first epitaxial layer 238 is phosphorus (P), arsenic (As), or boron (B). When the first epitaxial layer 238 and the second epitaxial layer 240 are p-type, a germanium content in the first epitaxial layer 238 is smaller than a germanium content in the second epitaxial layer 240 to reduce lattice mismatch defects. As shown in FIG. 13, the second epitaxial layer 240 is allowed to grow from both sidewalls of the first epitaxial layer 238 to merge at middle of the source/drain trench 228. Because the first epitaxial layer 238 and the second epitaxial layer 240 are formed epitaxially, the deposition of the second epitaxial layer 240 forms gaps 242 each defined by a bottom surface of the second epitaxial layer 240 and the bottom inner spacer layer 2340. In some embodiments represented in FIG. 13, each of the gaps 242 may expose portions of bottommost inner spacer features 234.

Referring to FIG. 14, block 122 deposits a third epitaxial layer 244 over top surfaces of the second epitaxial layer 240. In some embodiments, the third epitaxial layer 244 may be deposited using vapor-phase epitaxy (VPE), ultra-high vacuum CVD (UHV-CVD), molecular beam epitaxy (MBE), and/or other suitable processes. The third epitaxial layer 244 serves as a capping epitaxial layer to prevent dopant in the second epitaxial layer 240 from diffusing into adjacent structures before source/drain contacts are formed. To properly serve as a capping epitaxial layer, the third epitaxial layer 244 may be doped, albeit at a dopant concentration smaller than that in the second epitaxial layer 240. Like the first epitaxial layer 238 and the second epitaxial layer 240, the third epitaxial layer 244 may be n-type or p-type. When the third epitaxial layer 244 is n-type, it may include phosphorus-doped silicon (Si:P) or arsenic-doped silicon (Si:As). When the third epitaxial layer 244 is p-type, it may include boron-doped silicon germanium (SiGe:B).

Referring still to FIG. 14, the first epitaxial layer 238, the second epitaxial layer 240 and the third epitaxial layer 244 over one source/drain region 212SD may be collectively referred to as a source/drain feature 246. The source/drain feature 246 interfaces sidewalls of the channel layers 208 by way of the first epitaxial layer 238.

The second epitaxial layer 240 account for a majority of a total volume of the source/drain feature 246. The second epitaxial layer 240 is spaced apart from the sidewalls of the channel layers 208 by the first epitaxial layer 238. The second epitaxial layer 240 may come in direct contact with sidewalls of the inner spacer features 234. The third epitaxial layer 244 prevents dopant diffusion from the heavily doped second epitaxial layer 240. FIG. 14 illustrates that the gap 242 and the bottom inner spacer layer 2340 insulate the source/drain feature 246 from the substrate and the base fin structure 212B.

Figure 15:
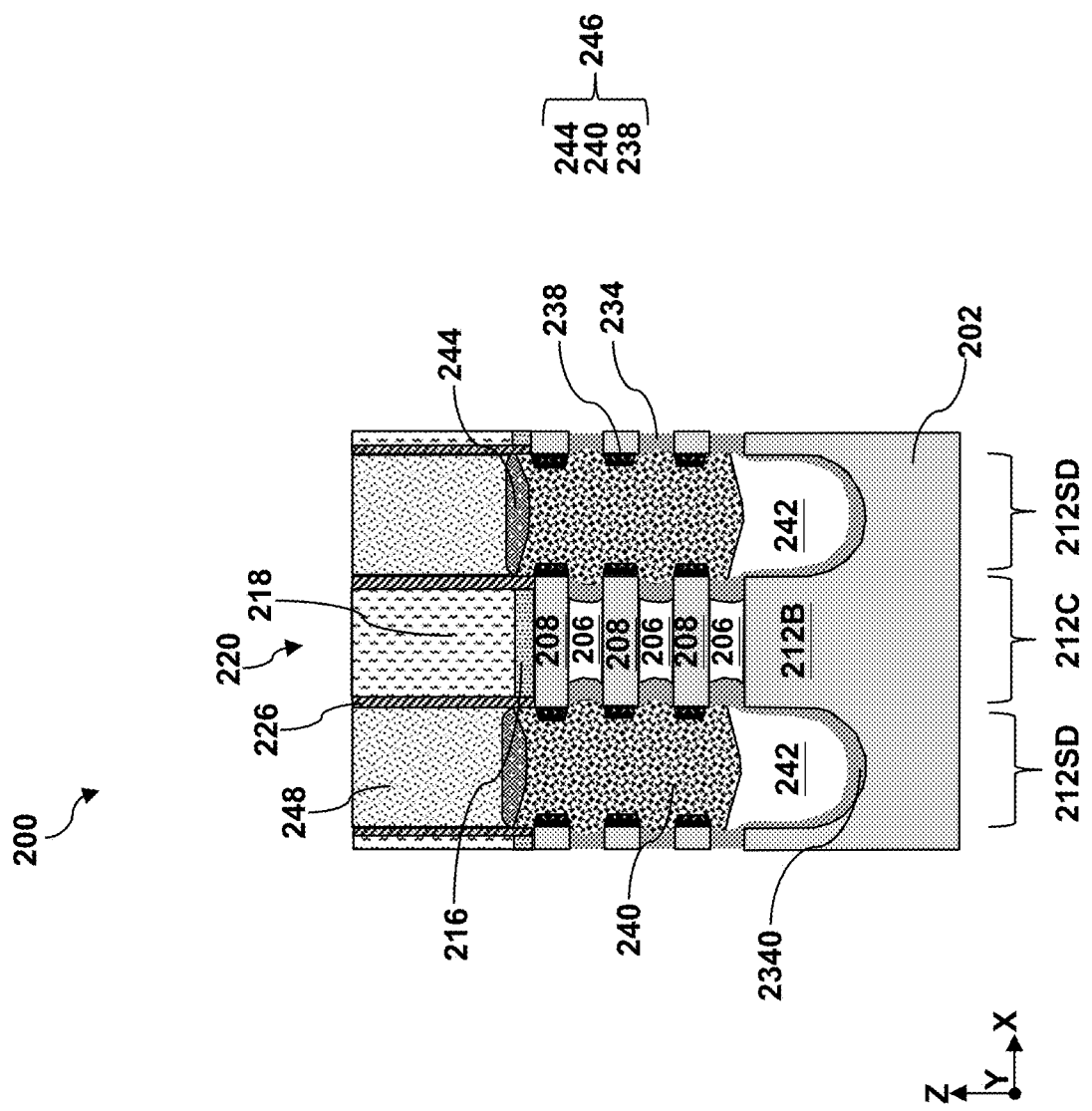

Referring to FIGS. 1 and 15-22, method 100 includes a block 124 where the dummy gate stack 220 is replaced with a gate structure 260. Block 124 may include deposition of an interlayer dielectric (ILD) layer 248 over the third epitaxial layer 244 (shown in FIG. 15), removal of the dummy gate stack 220 (shown in FIG. 16), selective removal of the sacrificial layers 206 in the channel region 212C to release the channel layers 208 as channel members 2080 (shown in FIG. 17), and formation of the gate structure 260 to wrap around each of the channel members 2080 (shown in FIG. 18). Referring to FIG. 15, the ILD layer 248 is deposited over the workpiece 200, including over the third epitaxial layer 244. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited using CVD, FCVD, spin-on coating, or a suitable deposition technique. In some alternative embodiments not explicitly shown in FIG. 15, a contact etch stop layer (CESL) may be deposited over the third epitaxial layer 244 before the deposition of the ILD layer 248. The CESL may include silicon nitride. After the deposition of the ILD layer 248, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220.

Figure 16:
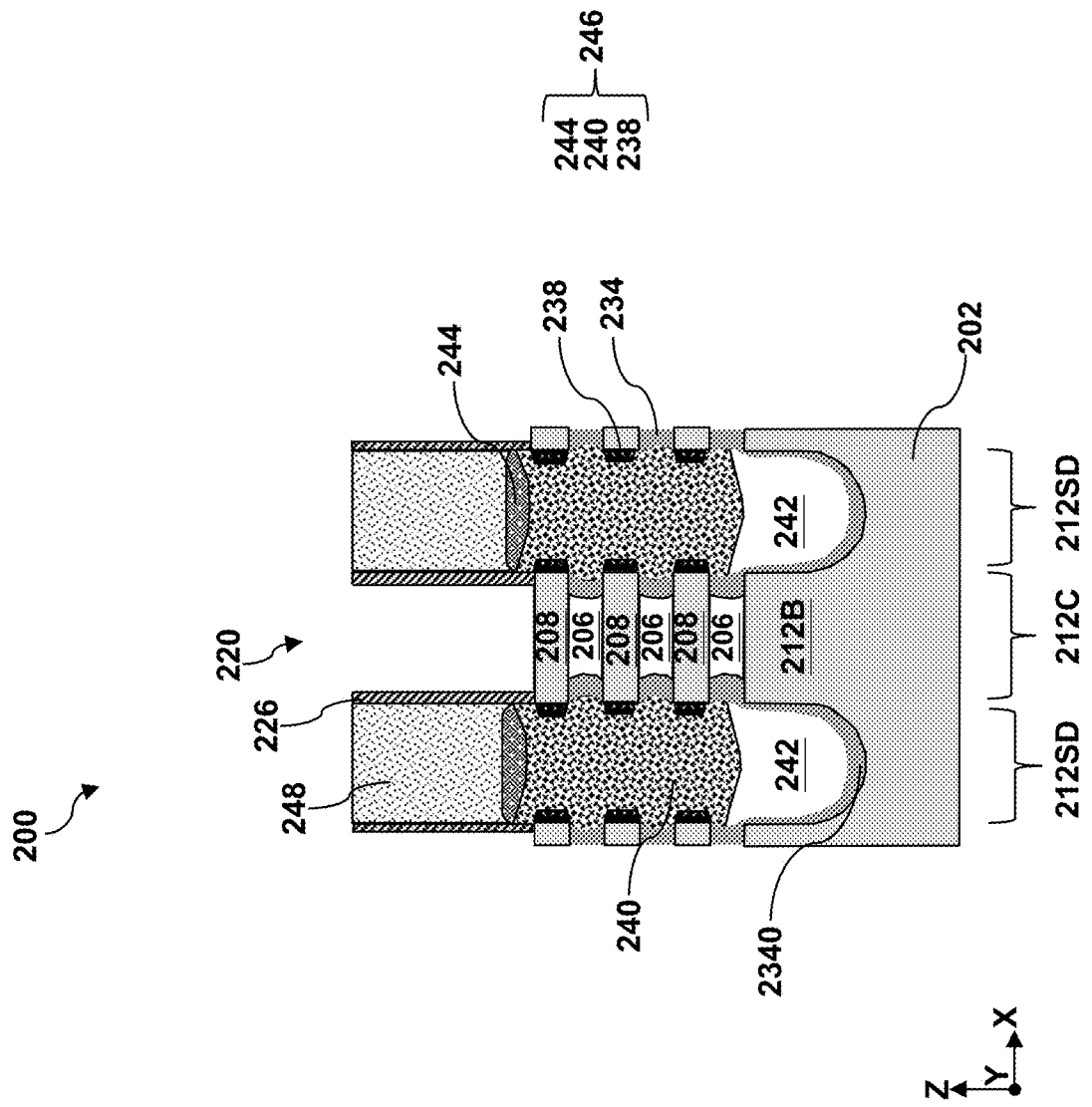
Figure 17:
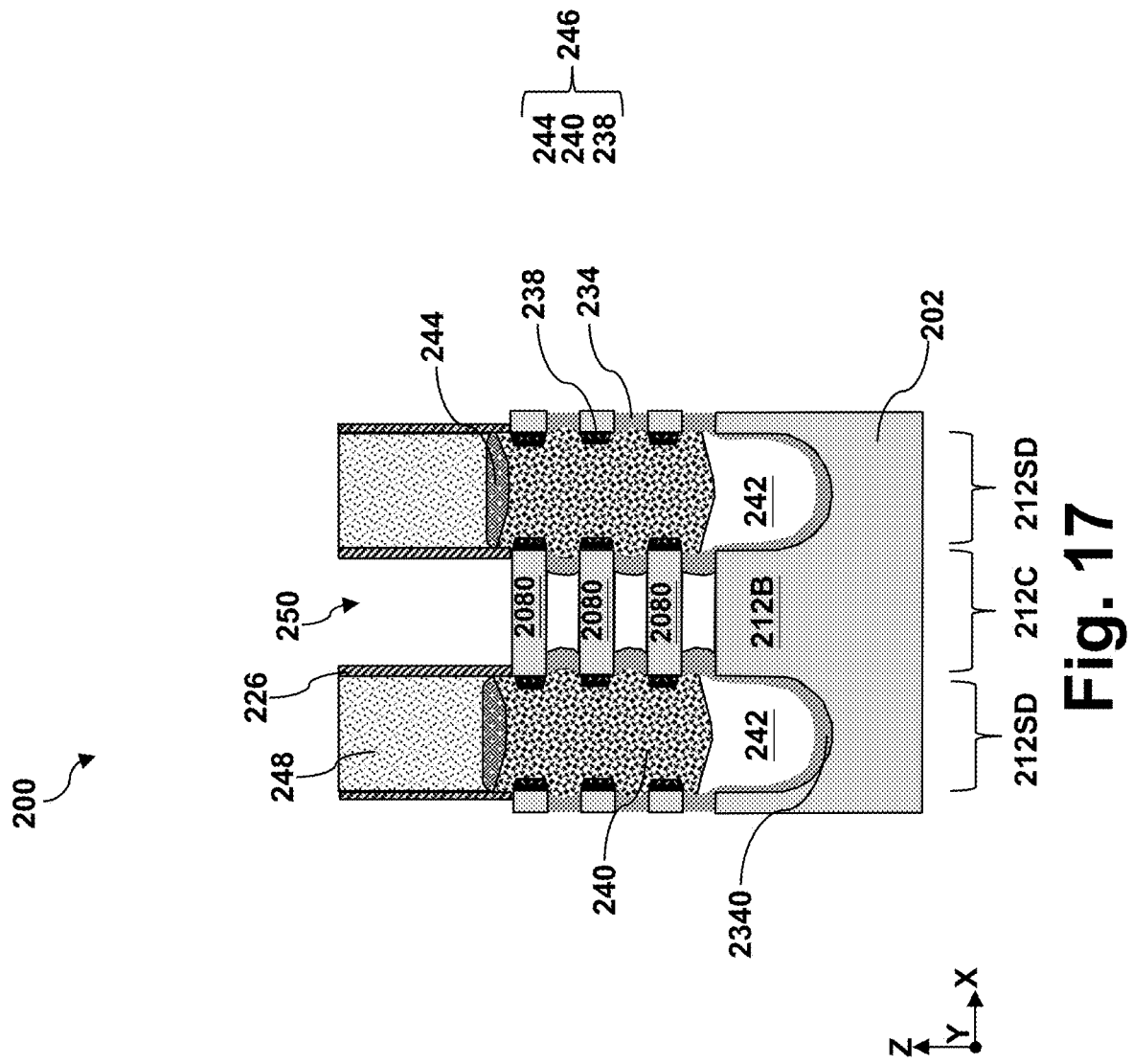

Referring to FIG. 16, the dummy gate stack 220 is removed. The removal of the dummy gate stack 220 may include one or more etching processes that are selective to the material of the dummy gate stack 220. For example, the removal of the dummy gate stack 220 may be performed using a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed. Referring to FIG. 17, after the removal of the dummy gate stack 220, the sacrificial layers 206 between the channel layers 208 in the channel region 212C are selectively removed. The selective removal of the sacrificial layers 206 releases the channel layers 208 (shown in FIG. 16) to form channel members 2080 shown in FIG. 17. The selective removal of the sacrificial layers 206 forms a gate trench 250 that includes spaces between adjacent channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 18:
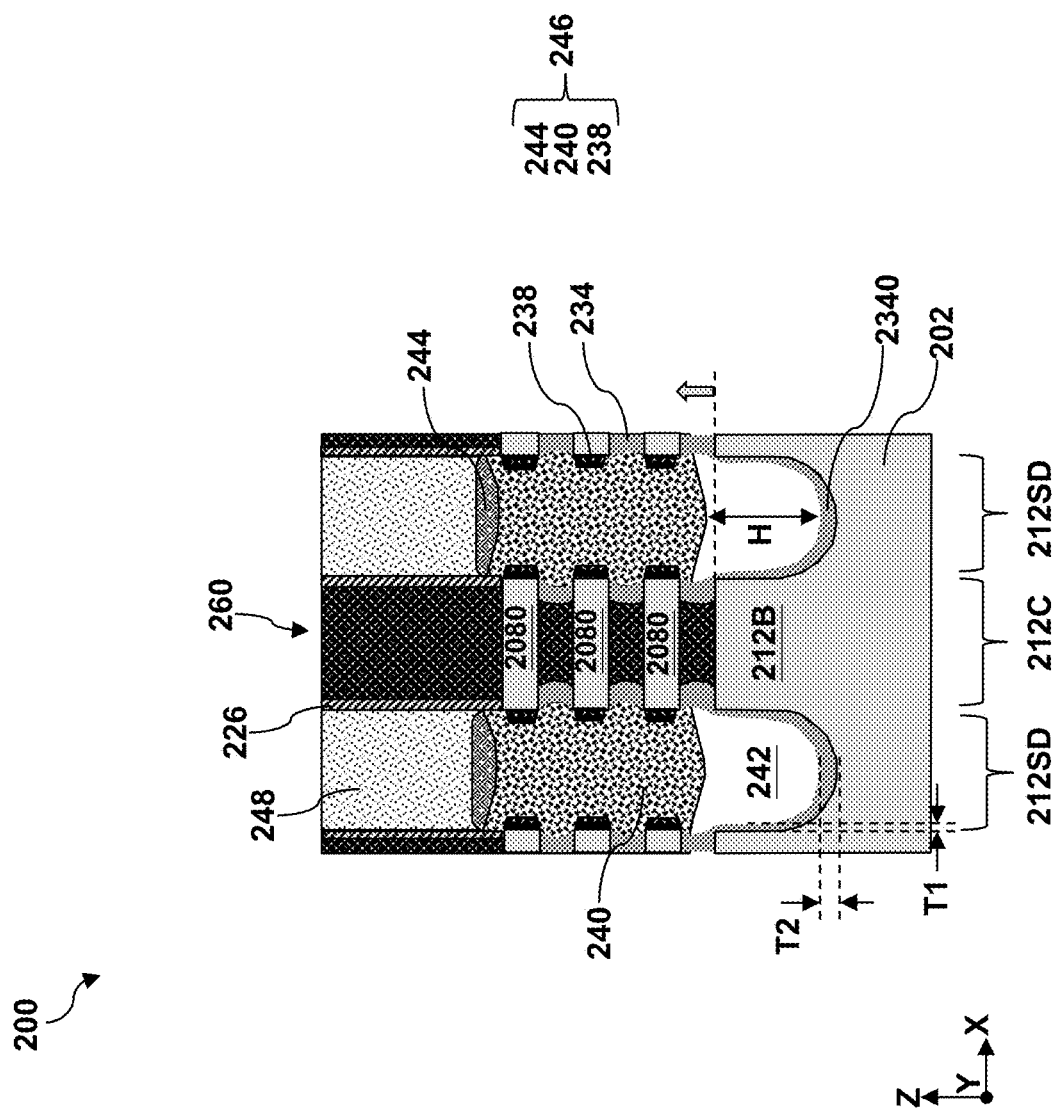

Referring to FIG. 18, after the release of the channel members 2080, the gate structure 260 is deposited in the gate trench 250 to wrap around each of the channel members 2080. While not explicitly shown, the gate structure 260 includes an interfacial layer interfacing the channel members 2080 and the base fin structure 212B in the channel region 212C, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 260 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure. The gate structure includes portions that interpose between channel members 2080 in the channel region 212C.

Figure 19:
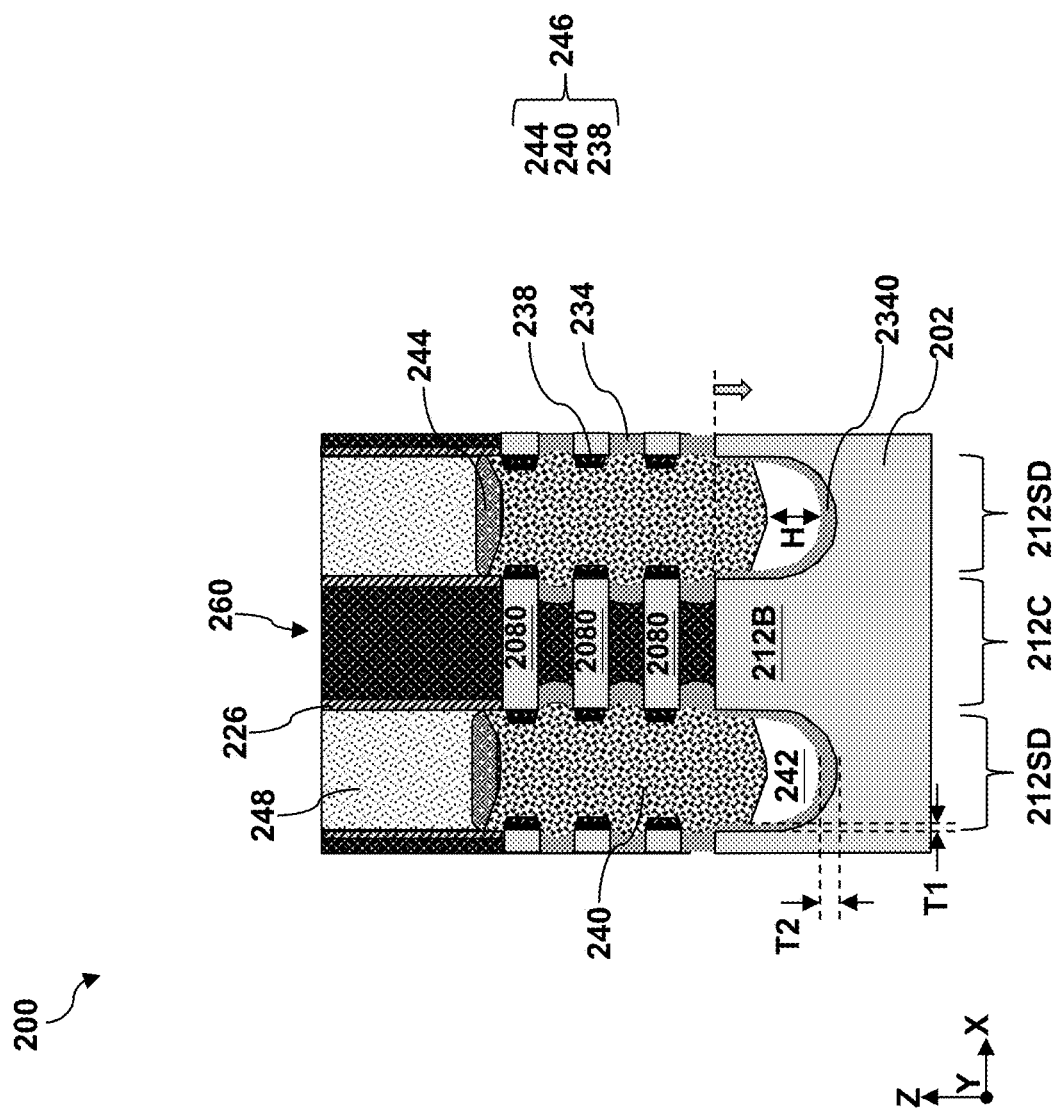

Reference is now made to FIGS. 18 and 19. The deposition of the second epitaxial layer 240 may be configured to vary a volume of the second epitaxial feature 240. When the deposition of the second epitaxial layer 240 at block 122 is made more selective, the second epitaxial layer 240 has a smaller volume and a bottom surface of the second epitaxial layer 240 may be higher than a top surface of the base fin structure 212B as shown in FIG. 18. When the deposition of the second epitaxial layer 240 at block 122 is made less selective, the second epitaxial layer 240 has a greater volume and a bottom surface of the second epitaxial layer 240 may be lower than a top surface of the base fin structure 212B as shown in FIG. 19. Because the second epitaxial layer 240 is the heaviest-doped layer, the volume of the second epitaxial layer 240 affects the contact resistance of the source/drain feature 246. When the volume of the second epitaxial layer 240 is greater, the contact resistance of the source/drain feature 246 is lower. When the volume of the second epitaxial layer 240 is smaller, the contact resistance of the source/drain feature 246 is greater. In some embodiments, the deposition of the second epitaxial layer 240 may be made more selective by having a higher process temperature and less selective by having a lower process temperature. The gap 242 in FIG. 18 or 19 has a height H and the height H may be between about 2 nm and about 20 nm.

Figure 20:
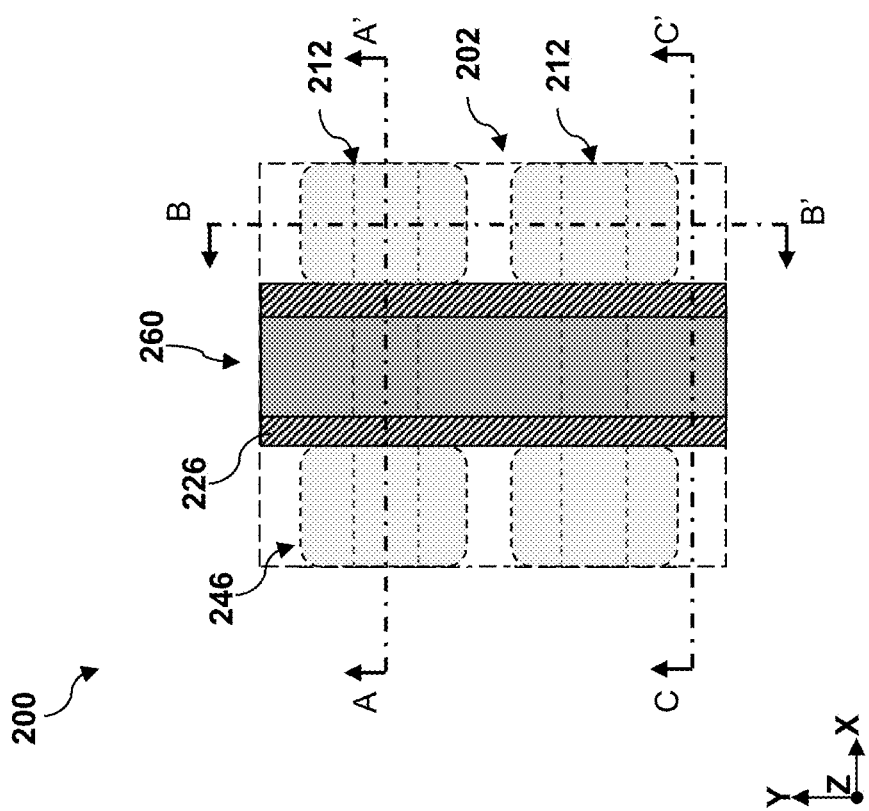

FIG. 20 illustrates a fragmentary top view of the workpiece 200. FIG. 20 is useful in illustrating the cross-section lines for FIGS. 2-19 and 21-22. FIG. 20 illustrates a portion of the workpiece 200. The illustrated portion of the workpiece 200 in FIG. 20 includes two fin-shaped structures 212 or two fin-shaped active regions 212 extending lengthwise along the X direction. The gate structure 260 extends along the Y direction to span over channel regions of the two fin-shaped structures 212. The gate structure 260 wraps around each of the channel members 2080 in the two fin-shaped active regions 212. The channel region of each of the fin-shaped structures 212 is sandwiched between two source/drain regions along the X direction. A source/drain feature 246 is disposed over the source/drain region. Sidewalls of the gate structure 260 are lined by the gate spacer layer 226. FIG. 20 includes three cross-sectional lines-line A-A', line B-B' and line C-C'. Line A-A' extends along the X direction and cuts through the, the fin-shaped active region 212, the source/drain features 246, the gate spacer layers 226, the channel members 2080, and the gate structure 260. Line B-B' extends along the Y direction to pass through two source/drain features 246. Line C-C' extends along the X direction and cuts through the gate spacer layers 226 and the gate structure 260. FIGS. 2-19 include fragmentary cross-sectional views along line A-A'

Figure 21:
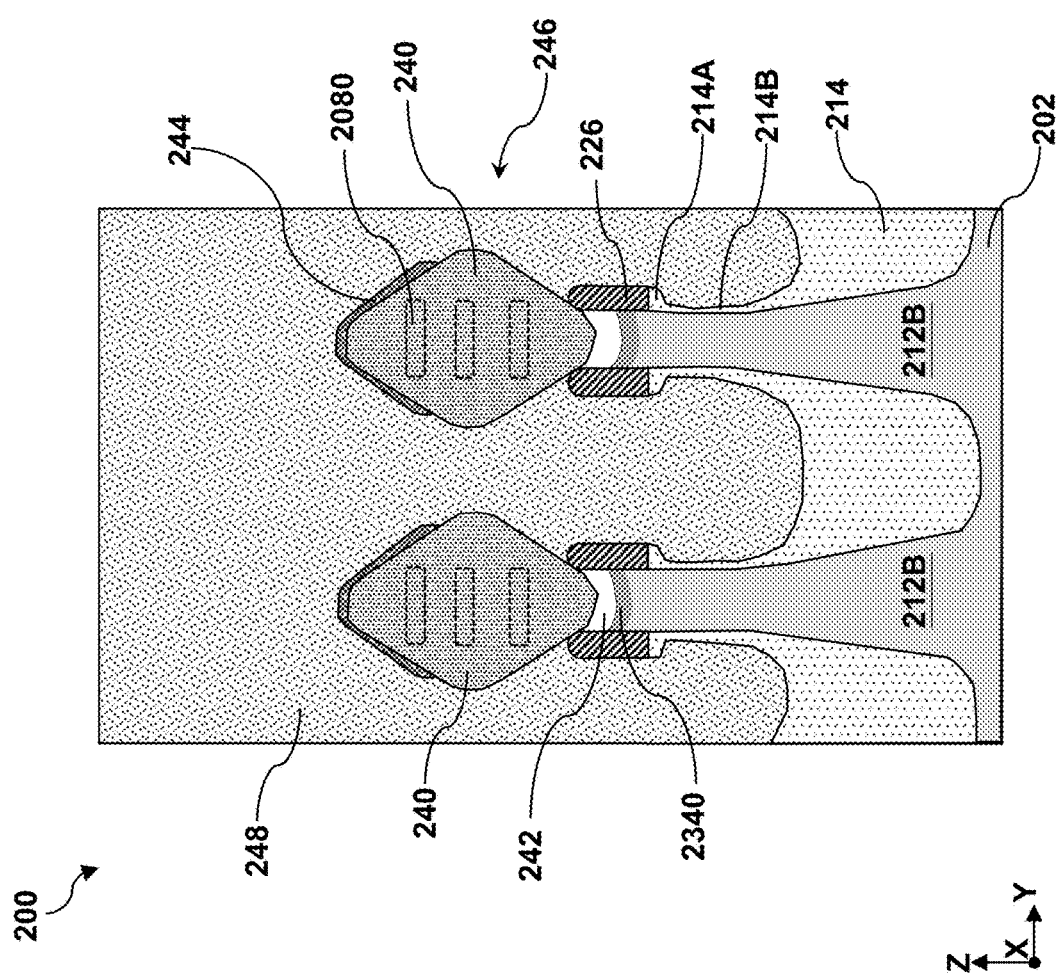

FIG. 21 illustrates a fragmentary cross-section view of the workpiece 200 along line B-B'. FIG. 21 illustrates two base fin structures 212B extending from the substrate 202. The two fin base structures 212B are spaced apart from one another by the isolation feature 214 along the Y direction. The gate spacer layer 226 is disposed on the isolation feature 214 and extends along sidewalls of the base fin structure 212B. The gate spacer layer 226 that is disposed along sidewalls of the base fin structure 212B may be referred to as fin sidewalls 226. The workpiece 200 includes bottom inner spacer layer 2340 disposed on top surfaces of the base fin structures 212B. Along the Y direction, the bottom inner spacer layer 2340 is sandwiched between two fin sidewalls 226. Each of the gaps 242 is vertically sandwiched between the bottom inner spacer layer 2340 and the source/drain feature 246. Each of the gaps 242 is defined between two fin sidewalls 226 along the Y direction. In some embodiments, each of the source/drain features 246 is in direct contact with the fin sidewalls 226. The ILD layer 248 is disposed over the isolation feature 214, the fin sidewalls 226, and the source/drain features 246. In some embodiments not explicitly shown in the figures, the ILD layer 248 is spaced apart from the source/drain features 246, the fin sidewalls 226, and the isolation feature 214 by a contact etch stop layer.

The isolation feature 214 includes a top portion 214A directly below the fin sidewalls 226 and a neck portion 214B extending between the bulk isolation feature 214 and the top portion 214A. In some embodiments represented in FIG. 21, the etching back of the inner spacer material layer 232 and the polymer protection layer 236 at block 118 also etches the isolation feature 214. The etching back may cause undercut below the fin sidewalls 226, causing the top portion 214A to overhang the neck portion 214B. In other words, a portion of the ILD layer 248 may partially extend below the top portion 214A.

Figure 22:
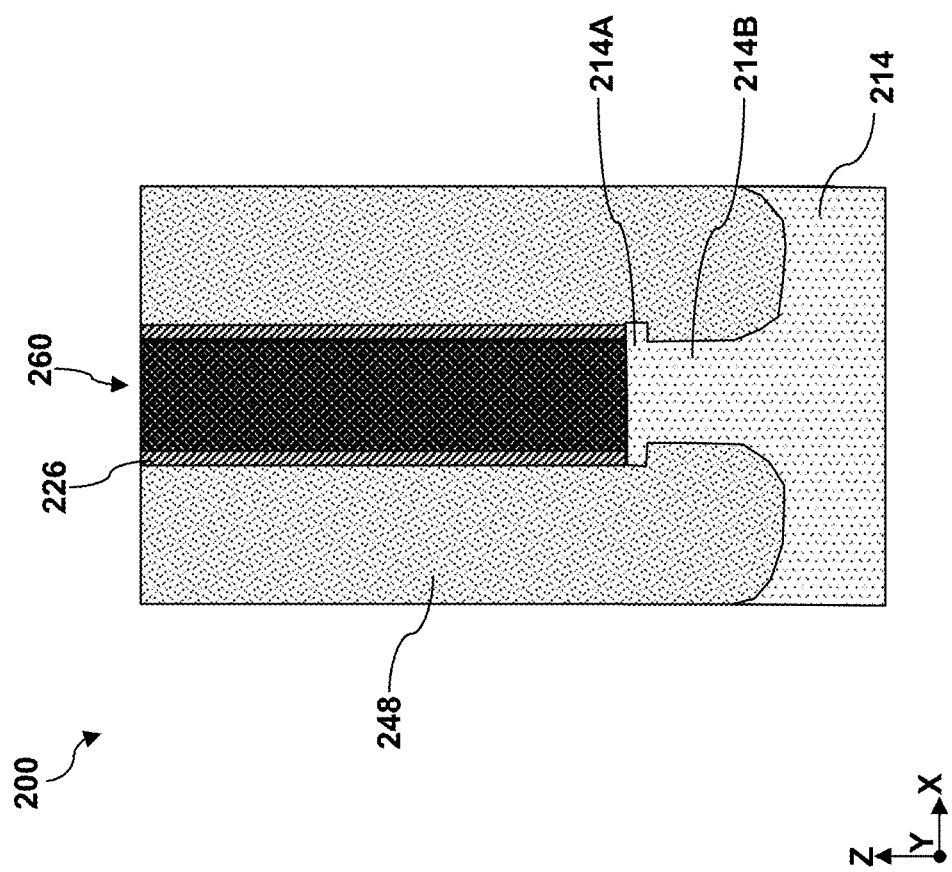
FIG. 22 is a fragmentary cross-sectional view of a gate structure, according to one or more aspects of the present disclosure.

FIG. 22 illustrates a fragmentary cross-section view of the workpiece 200 along line C-C' shown in FIG. 20. Because line C-C' cuts through the gate structure 260 without passing through any of the source/drain features 246, FIG. 22 shows a portion of the gate structure 260 being disposed on the isolation feature 214. As described above with respect to FIG. 21, the isolation feature 214 includes the top portion 214A in contact with the gate spacer layer 226 and the gate structure 260 and the neck portion 214B underlying the top portion 214A. The etching at block 118 undercuts the isolation feature 214 such that the top portion 214A overhangs the neck portion 214B. In other words, the ILD layer 248 partially extends below a portion of the top portion 214A of the isolation feature 214.

In one exemplary aspect, the present disclosure is directed to a method. The method includes forming a fin-shaped structure over a substrate, the fin-shaped structure including a plurality of channel layers interleaved by a plurality of sacrificial layers, recessing a source/drain region of the fin-shaped structure to form a source/drain recess that exposes a portion of the substrate, sidewalls of the plurality of sacrificial layers, and sidewalls of the plurality of channel layers, selectively and partially recessing the sidewalls of the plurality of sacrificial layers to form inner spacer recesses, conformally depositing a dielectric layer over the substrate and the inner spacer recesses, depositing a polymer layer over the dielectric layer such that a top surface of the polymer layer is lower than a top surface of the fin-shaped structure, etching back the polymer layer and the dielectric layer to form inner spacer features in the inner spacer recesses and an inner spacer layer over the portion of the substrate, and epitaxially depositing more than one epitaxial layer from the sidewalls of the plurality of channel layers to form a source/drain feature in the source/drain recess. The source/drain feature and the inner spacer layer define a gap.

In some embodiments, the dielectric layer includes silicon, oxygen, carbon, and nitrogen. In some implementations, the polymer layer includes carbon, hydrogen, oxygen, and fluorine. In some instances, the polymer layer is free of silicon. In some embodiments, surfaces of the inner spacer layer are substantially free of the more than one epitaxial layer. In some implementations, during the etching back, an etching rate of the polymer layer is smaller than an etching rate of the dielectric layer. In some embodiments, the method further includes, after the etching back, selectively removing the polymer layer. In some embodiments, after the etching back, the substrate is substantially covered by the inner spacer layer.

In another exemplary aspect, the present disclosure is directed to a method. The method includes receiving a workpiece that includes a substrate, and a fin-shaped structure over the substrate, the fin-shaped structure including a base fin and a semiconductor stack over the base fin, the semiconductor stack including first semiconductor layers interleaved by second semiconductor layers, forming a dummy gate stack over a channel region of the fin-shaped structure, depositing a top spacer layer over the workpiece, after the depositing of the top spacer layer, recessing the workpiece to form a source/drain recess over a source/drain region of the fin-shaped structure, the source/drain recess extending into the substrate and exposing sidewalls of the first semiconductor layers and the second semiconductor layers, selectively and partially recessing the sidewalls of the second semiconductor layers to form inner spacer recesses, conformally depositing a dielectric layer over the substrate and the inner spacer recesses, depositing a polymer layer over the dielectric layer such that a top surface of the polymer layer is lower than a top surface of the fin-shaped structure, etching back the polymer layer and the dielectric layer to form inner spacer features in the inner spacer recesses and an inner spacer layer over the substrate, after the etching back, removing the polymer layer, selectively depositing a first epitaxial layer on the sidewalls of the first semiconductor layers, and selectively depositing a second epitaxial layer on surfaces of the first epitaxial layer. The inner spacer layer includes a bottom portion disposed on a top facing portion of the substrate and a sidewall portion disposed on a sidewall of the substrate. A thickness of the bottom portion is greater than a thickness of the sidewall portion.

In some embodiments, the first epitaxial layer and the second epitaxial layer include a semiconductor material and a dopant. A first concentration of the dopant in the first epitaxial layer is smaller than a second concentration of the dopant in the second epitaxial layer. In some implementations, a bottom surface of the second epitaxial layer is lower than a top surface of the base fin by between about 1 nm and about 15 nm. In some embodiments, a bottom surface of the second epitaxial layer is higher than a top surface of the base fin by between about 1 nm and about 5 nm. In some instances, a top surface of the bottom portion is spaced apart from the second epitaxial layer by a gap. In some embodiments, the depositing of the top spacer layer forms a first spacer sidewall and a second spacer sidewall extending along sidewalls of the base fin. In some instances, the gap is disposed between the first spacer sidewall and the second spacer sidewall.

In yet another exemplary aspect, the present disclosure is directed to a semiconductor structure. The semiconductor structure includes a substrate, a base fin extending from the substrate, a vertical stack of nanostructures disposed directly over the base fin, a source/drain feature in contact with end surfaces of the vertical stack of nanostructures, and a bottom dielectric layer including a bottom portion disposed on the substrate and a sidewall portion disposed on a sidewall of the base fin. A bottom surface of the source/drain feature is spaced apart from the bottom portion by a gap.

In some embodiments, a thickness of the bottom portion is greater than a thickness of the sidewall portion. In some implementations, the semiconductor structure further includes a gate structure wrapping around each of the vertical stack of nanostructures and in contact with a top surface of the base fin. In some instances, the gate structure is spaced apart from the source/drain feature by a plurality of inner spacer features that interleave the vertical stack of nanostructures. In some embodiments, a bottommost one of the plurality of inner spacer features is contiguous with the sidewall portion.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a fin-shaped structure over a substrate, the fin-shaped structure comprising a plurality of channel layers interleaved by a plurality of sacrificial layers;
recessing a source/drain region of the fin-shaped structure to form a source/drain recess that exposes a portion of the substrate, sidewalls of the plurality of sacrificial layers, and sidewalls of the plurality of channel layers;
selectively and partially recessing the sidewalls of the plurality of sacrificial layers to form inner spacer recesses;
conformally depositing a dielectric layer over the substrate and the inner spacer recesses;
depositing a polymer layer over the dielectric layer;
after the depositing of the polymer layer, curing the polymer layer such that a topmost surface of the cured polymer layer is lower than a top surface of a topmost one of the plurality of channel layers;
after the curing, etching back the polymer layer and the dielectric layer to form inner spacer features in the inner spacer recesses and an inner spacer layer over the portion of the substrate; and
epitaxially depositing more than one epitaxial layer from the sidewalls of the plurality of channel layers to form a source/drain feature in the source/drain recess,
wherein the source/drain feature and the inner spacer layer define a gap.

2. The method of claim 1, wherein the dielectric layer comprises silicon, oxygen, carbon, and nitrogen.

3. The method of claim 1, wherein the polymer layer comprises fluorinated silicone or fluorinated polysilane.

4. The method of claim 1, wherein the depositing of the polymer layer comprises chemical vapor deposition (CVD), spin-on coating, or flowable CVD (FCVD).

5. The method of claim 1, wherein surfaces of the inner spacer layer are substantially free of the more than one epitaxial layer.

6. The method of claim 1, wherein, during the etching back, an etching rate of the polymer layer is smaller than an etching rate of the dielectric layer.

7. The method of claim 1, further comprising:
after the etching back, selectively removing the polymer layer.

8. The method of claim 1, wherein, after the etching back, the substrate is substantially covered by the inner spacer layer.

9. A method, comprising:
receiving a workpiece comprising:
a substrate, and
a fin-shaped structure over the substrate, the fin-shaped structure comprising a base fin and a semiconductor stack over the base fin, the semiconductor stack comprising first semiconductor layers interleaved by second semiconductor layers;
forming a dummy gate stack over a channel region of the fin-shaped structure;
depositing a top spacer layer over the workpiece;
after the depositing of the top spacer layer, recessing the workpiece to form a source/drain recess over a source/drain region of the fin-shaped structure, the source/drain recess extending into the substrate and exposing sidewalls of the first semiconductor layers and the second semiconductor layers;
selectively and partially recessing the sidewalls of the second semiconductor layers to form inner spacer recesses;
conformally depositing a dielectric layer over the substrate and the inner spacer recesses;
depositing a polymer layer over the dielectric layer;
after the depositing of the polymer layer, curing the polymer layer such that a topmost surface of the cured polymer layer is lower than a top surface of a topmost one of the first semiconductor layers;
after the curing, etching back the polymer layer and the dielectric layer to form inner spacer features in the inner spacer recesses and an inner spacer layer over the substrate;
after the etching back, removing the polymer layer;
selectively depositing a first epitaxial layer on the sidewalls of the first semiconductor layers; and
selectively depositing a second epitaxial layer on surfaces of the first epitaxial layer,
wherein the inner spacer layer comprises a bottom portion disposed on a top facing portion the substrate and a sidewall portion disposed on a sidewall of the substrate,
wherein a thickness of the bottom portion is greater than a thickness of the sidewall portion.

10. The method of claim 9,
wherein the first epitaxial layer and the second epitaxial layer comprise a semiconductor material and a dopant,
wherein a first concentration of the dopant in the first epitaxial layer is smaller than a second concentration of the dopant in the second epitaxial layer.

11. The method of claim 9, wherein a bottom surface of the second epitaxial layer is lower than a top surface of the base fin by between about 1 nm and about 15 nm.

12. The method of claim 9, wherein a bottom surface of the second epitaxial layer is higher than a top surface of the base fin by between about 1 nm and about 5 nm.

13. The method of claim 9, wherein a top surface of the bottom portion is spaced apart from the second epitaxial layer by a gap.

14. The method of claim 13, wherein the depositing of the top spacer layer forms a first spacer sidewall and a second spacer sidewall extending along sidewalls of the base fin.

15. The method of claim 14, wherein the gap is disposed between the first spacer sidewall and the second spacer sidewall.

16. A method, comprising:
forming a fin-shaped structure over a substrate, the fin-shaped structure comprising a base fin rising from the substrate and a semiconductor stack over the base fin, the semiconductor stack comprising a plurality of channel layers interleaved by a plurality of sacrificial layers;
forming a dummy gate stack over a channel region of the fin-shaped structure;
recessing a source/drain region of the fin-shaped structure to form a source/drain recess extending into the base fin;
selectively and partially recessing the sacrificial layers over the channel region to form inner spacer recesses;
conformally depositing a dielectric layer over the inner spacer recesses and the source/drain recess;
depositing a polymer layer over the dielectric layer;
after the depositing, curing the polymer layer such that a topmost surface of the cured polymer layer is lower than a top surface of a topmost one of the plurality of channel layers but is higher than a second topmost one of the plurality of channel layers;
after the curing, etching back the cured polymer layer and the dielectric layer to form inner spacer features in the inner spacer recesses and a bottom spacer layer over the source/drain recess;
after the etching back, removing the polymer layer;
selectively depositing a first epitaxial layer on sidewalls of the plurality of channel layers;
selectively depositing a second epitaxial layer on surfaces of the first epitaxial layer; and
depositing a third epitaxial layer over the second epitaxial layer,
wherein the polymer layer comprises fluorinated silicone or fluorinated polysilane.

17. The method of claim 16, wherein the depositing of the polymer layer comprises depositing the polymer layer using chemical vapor deposition (CVD), flowable CVD, or spin-on coating.

18. The method of claim 16, wherein the curing comprises annealing or use of ultraviolet (UV) radiation.

19. The method of claim 16, wherein a top surface of the bottom spacer layer is spaced apart from the second epitaxial layer by a gap.

20. The method of claim 16, wherein the dielectric layer comprises silicon oxide, silicon oxycarbonitride, silicon nitride, silicon oxynitride, or carbon-rich silicon carbonitride.

* * * * *